US012707745B2

(12) United States Patent
Moriya et al.

(10) Patent No.: US 12,707,745 B2
(45) Date of Patent: Aug. 11, 2026

(54) PHOTODETECTION DEVICE AND ELECTRONIC APPARATUS

(71) Applicant: SONY SEMICONDUCTOR SOLUTIONS CORPORATION, Kanagawa (JP)

(72) Inventors: Yusuke Moriya, Kanagawa (JP); Atsushi Yamamoto, Kanagawa (JP); Tomiyuki Yukawa, Chiba (JP); Kotaro Nishimura, Kanagawa (JP); Shigehiro Ikehara, Kanagawa (JP); Shogo Otani, Kanagawa (JP); Hiroshi Kato, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 216 days.

(21) Appl. No.: 18/546,252

(22) PCT Filed: Feb. 21, 2022

(86) PCT No.: PCT/JP2022/006922

§ 371 (c)(1),
(2) Date: Aug. 11, 2023

(87) PCT Pub. No.: WO2022/181536

PCT Pub. Date: Sep. 1, 2022

(65) Prior Publication Data

US 2024/0120359 A1 Apr. 11, 2024

(30) Foreign Application Priority Data

Feb. 25, 2021 (JP) ................................ 2021-028237

(51) Int. Cl.
*H10F 39/00* (2025.01)

(52) U.S. Cl.
CPC ....... *H10F 39/8063* (2025.01); *H10F 39/805* (2025.01)

(58) Field of Classification Search
CPC .. H10F 39/8063; H10F 39/805; H10F 39/024; H10F 39/12
See application file for complete search history.

(56) References Cited

U.S. PATENT DOCUMENTS

| | | | | |
|---|---|---|---|---|
| 2001/0009442 A1 * | 7/2001 | Fukuyoshi | G02B 3/0056 | 348/340 |
| 2012/0086093 A1 * | 4/2012 | Otsuka | H04N 23/10 | 257/E31.127 |

(Continued)

FOREIGN PATENT DOCUMENTS

| | | |
|---|---|---|
| JP | 2011-146481 | 7/2011 |
| JP | 2012-084608 | 4/2012 |

(Continued)

OTHER PUBLICATIONS

International Search Report and Written Opinion prepared by the Japan Patent Office on May 12, 2022, for International Application No. PCT/JP2022/006922, 3 pgs.

*Primary Examiner* — Jonathan Han
(74) *Attorney, Agent, or Firm* — SHERIDAN ROSS P.C.

(57) ABSTRACT

The present disclosure relates to a photodetection device and an electronic apparatus that allow for reducing surface reflection from an on-chip microlens and suppressing deterioration of image quality. Provided is a photodetection device including: a plurality of pixels that have photoelectric conversion units; on-chip microlenses that are formed in such a way as to correspond to the individual pixels; and an antireflection film that is formed on a surface of the on-chip microlens, in which the antireflection film is constituted by a stacking of: a first inorganic film that is formed by a metal oxide film; and a second inorganic film that is formed on a (Continued)

surface of the first inorganic film and has a lower refractive index than the first inorganic film. The present disclosure can be applied to, for example, a CMOS solid-state imaging device.

23 Claims, 17 Drawing Sheets

(56) References Cited

U.S. PATENT DOCUMENTS

| | | | | |
|---|---|---|---|---|
| 2015/0123227 | A1* | 5/2015 | Ootsuka | H10F 39/024 257/432 |
| 2019/0385968 | A1* | 12/2019 | Fujimagari | H10F 39/018 |

FOREIGN PATENT DOCUMENTS

| | | |
|---|---|---|
| JP | 2013-012518 | 1/2013 |
| JP | 2016-057335 | 4/2016 |
| JP | 2017-076738 | 4/2017 |
| WO | WO 2013/179972 | 12/2013 |
| WO | WO-2020122032 A1 | 6/2020 |

* cited by examiner

100
ELECTRONIC APPARATUS
111
112
LIGHT DETECTION ELEMENT
113
DSP
110
CPU
115
DISPLAY
116
OPERATION SYSTEM
120
114
FRAME MEMORY
117
AUXILIARY MEMORY
118
COMMUNICATION I/F
119
POWER SUPPLY SYSTEM 12000
12050 INTEGRATED CONTROL UNIT
12051 MICROCOMPUTER
12052 SOUND/IMAGE OUTPUT UNIT
12053 VEHICLE-MOUNTED NETWORK I/F
12061 AUDIO SPEAKER
12062 DISPLAY UNIT
12063 INSTRUMENT PANEL
12001 COMMUNICATION NETWORK
12010 DRIVING SYSTEM CONTROL UNIT
12020 BODY SYSTEM CONTROL UNIT
12030 OUTSIDE-VEHICLE INFORMATION DETECTING UNIT
12031 IMAGING UNIT
12040 IN-VEHICLE INFORMATION DETECTING UNIT
12041 DRIVER STATE DETECTION UNIT

PHOTODETECTION DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2022/006922, having an international filing date of 21 Feb. 2022, which designated the United States, which PCT application claimed the benefit of Japanese Patent Application No. 2021-028237, filed 25 Feb. 2021, the entire disclosures of each of which are incorporated herein by reference.

TECHNICAL FIELD

The present disclosure relates to a photodetection device and an electronic apparatus, and more particularly to a photodetection device and an electronic apparatus that allow for reducing surface reflection from an on-chip microlens and suppressing deterioration of image quality.

BACKGROUND ART

In a solid-state imaging device, in order to enhance sensitivity characteristics, an on-chip microlens (on-chip lens) is formed on a color filter for each pixel, and incident light is collected on a photodiode by the on-chip microlens.

A technology for forming an antireflection film on a surface of an on-chip microlens is known. With this antireflection film, flare and the like caused by reflection can be suppressed, and the sensitivity characteristics can be enhanced.

Patent Document 1 discloses a technology in which a layer having a higher refractive index formed by a silicon nitride film (SiN film) or a silicon oxynitride film (SiON film) and a layer having a lower refractive index formed by a silicon oxide film (SiO film) or a silicon oxycarbide film (SiOC film) are stacked on a surface of an on-chip microlens for a further reduction in reflectance.

CITATION LIST

Patent Document

Patent Document 1: Japanese Patent Application Laid-Open No. 2012-84608

SUMMARY OF THE INVENTION

Problems to be Solved by the Invention

Patent Document 1 discloses a configuration using a silicon nitride film as a layer having a higher refractive index in an antireflection film, and it has been confirmed that there is a possibility that the silicon nitride film is oxidized at an interface between the on-chip microlens and the silicon nitride film, and this may affect characteristics.

Thus, it has been required to reduce surface reflection from an on-chip microlens by an antireflection film having higher reliability and suppress deterioration of image quality.

The present disclosure has been made in view of such a situation, and an object thereof is to reduce surface reflection from an on-chip microlens and suppress deterioration of image quality.

Solutions to Problems

One aspect of the present disclosure provides a photodetection device including: a plurality of pixels that have photoelectric conversion units; on-chip microlenses that are formed in such a way as to correspond to the individual pixels; and an antireflection film that is formed on a surface of the on-chip microlens, in which the antireflection film is constituted by a stacking of: a first inorganic film that is formed by a metal oxide film; and a second inorganic film that is formed on a surface of the first inorganic film and has a lower refractive index than the first inorganic film.

In a photodetection device according to one aspect of the present disclosure, an antireflection film is formed on a surface of an on-chip microlens that is formed in such a way as to correspond to each one of a plurality of pixels that have photoelectric conversion units, and the antireflection film is constituted by a stacking of: a first inorganic film formed by a metal oxide film; and a second inorganic film that is formed on a surface of the first inorganic film and has a lower refractive index than the first inorganic film.

One aspect of the present disclosure provides a photodetection device including: a plurality of pixels that have photoelectric conversion units; on-chip microlenses that are formed in such a way as to correspond to the individual pixels; and an antireflection film that is formed on a surface of the on-chip microlens, in which the antireflection film is constituted by a stacking of: a first inorganic film; and a second inorganic film that is a structural film formed on a surface of the first inorganic film and formed by processing a surface of a film to be processed having a predetermined refractive index into a fine uneven shape.

In a photodetection device according to one aspect of the present disclosure, an antireflection film is formed on a surface of an on-chip microlens that is formed in such a way as to correspond to each one of a plurality of pixels that have photoelectric conversion units, and the antireflection film is constituted by a stacking of: a first inorganic film; and a second inorganic film that is a structural film formed on a surface of the first inorganic film and formed by processing a surface of a film to be processed having a predetermined refractive index into a fine uneven shape.

One aspect of the present disclosure provides an electronic apparatus on which a photodetection device is mounted, the photodetection device including: a plurality of pixels that have photoelectric conversion units; on-chip microlenses that are formed in such a way as to correspond to the individual pixels; and an antireflection film that is formed on a surface of the on-chip microlens, in which the antireflection film is constituted by a stacking of: a first inorganic film that is formed by a metal oxide film; and a second inorganic film that is formed on a surface of the first inorganic film and has a lower refractive index than the first inorganic film.

In an electronic apparatus according to one aspect of the present disclosure, in a photodetection device mounted on the electronic apparatus, an antireflection film is formed on a surface of an on-chip microlens that is formed in such a way as to correspond to each one of a plurality of pixels that have photoelectric conversion units, and the antireflection film is constituted by a stacking of: a first inorganic film formed by a metal oxide film; and a second inorganic film that is formed on a surface of the first inorganic film and has a lower refractive index than the first inorganic film.

Note that the photodetection device and the electronic apparatus according to one aspect of the present disclosure may be an independent device or an internal block constituting one device.

MODE FOR CARRYING OUT THE INVENTION

1. First Embodiment (Configuration of Photodetection Device)

Figure 1:
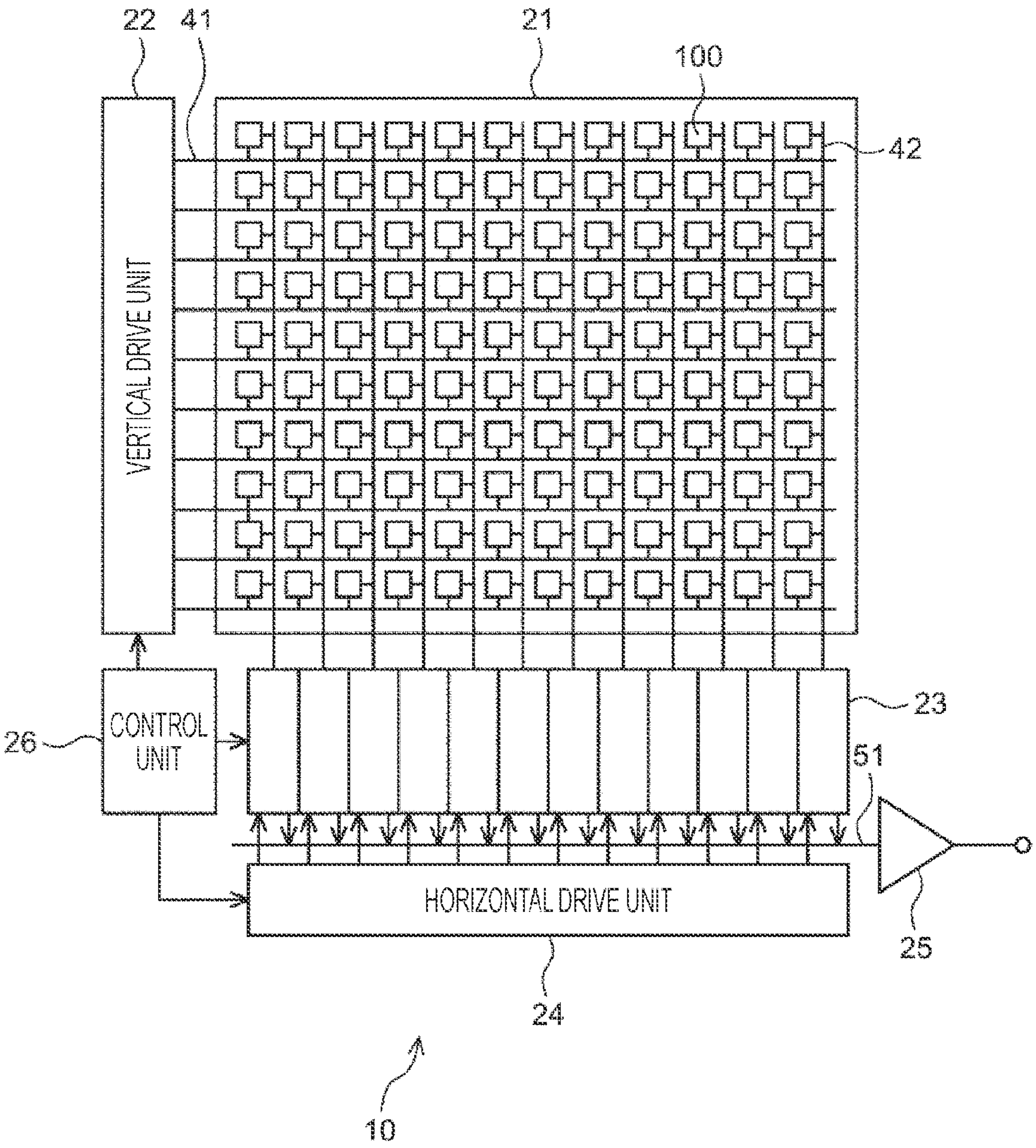
FIG. 1 is a diagram illustrating a configuration example of a photodetection device to which the present disclosure is applied.

FIG. 1 is a diagram illustrating a configuration example of a photodetection device to which the present disclosure is applied.

In FIG. 1, a solid-state imaging device 10 is a complementary metal oxide semiconductor (CMOS) solid-state imaging device, and is an example of the photodetection device to which the present disclosure is applied. The solid-state imaging device 10 is constituted by a pixel array unit 21, a vertical drive unit 22, a column signal processing unit 23, a horizontal drive unit 24, an output unit 25, and a control unit 26.

The pixel array unit 21 has a plurality of pixels 100 two-dimensionally arranged in a matrix on a substrate constituted by silicon (Si). The pixel 100 has a photoelectric conversion unit constituted by a photodiode and a plurality of pixel transistors. The pixel transistors are constituted by a transfer transistor, a reset transistor, a selection transistor, and an amplification transistor.

In the pixel array unit 21, for the plurality of pixels 100 two-dimensionally arranged in a matrix, a pixel drive line 41 is formed for each row and connected to the vertical drive unit 22, and a vertical signal line 42 is formed for each column and connected to the column signal processing unit 23.

The vertical drive unit 22 is constituted by a shift register, an address decoder, and the like, and drives each pixel 100 arranged in the pixel array unit 21. Pixel signals output from the pixels 100 selectively scanned by the vertical drive unit 22 are supplied to the column signal processing unit 23 through the vertical signal lines 42.

The column signal processing unit 23 performs predetermined signal processing on the pixel signal output from each pixel 100 of a selected row through the vertical signal line 42 for each pixel column of the pixel array unit 21, and temporarily retains the pixel signal after the signal processing. Specifically, the column signal processing unit 23 performs, as the signal processing, at least noise removal processing and correlated double sampling (CDS) processing.

The correlated double sampling removes fixed pattern noise unique to the pixel, such as reset noise and threshold variation of the amplification transistor. Note that, it is also possible to provide the column signal processing unit 23 with an analog to digital conversion (AD conversion) function, for example, in addition to the noise removal processing and output a signal level as a digital signal.

The horizontal drive unit 24 is constituted by a shift register, an address decoder, and the like, and sequentially selects a unit circuit corresponding to a pixel column of the column signal processing unit 23. As a result of selective scanning by the horizontal drive unit 24, the pixel signal subjected to the signal processing by the column signal processing unit 23 is output to the output unit 25 through a horizontal signal line 51.

The output unit 25 performs predetermined signal processing on the pixel signals input in sequence from each of the column signal processing units 23 through the horizontal signal line 51, and outputs signals obtained as a result of the signal processing.

The control unit 26 is constituted by a timing generator that generates various timing signals and the like, and controls driving of the vertical drive unit 22, the column signal processing unit 23, the horizontal drive unit 24, and the like on the basis of the various timing signals generated by the timing generator.

(Configuration of Pixel)

Next, the configuration of the pixels 100 two-dimensionally arranged in the pixel array unit 21 in the solid-state imaging device 10 will be described.

Figure 2:
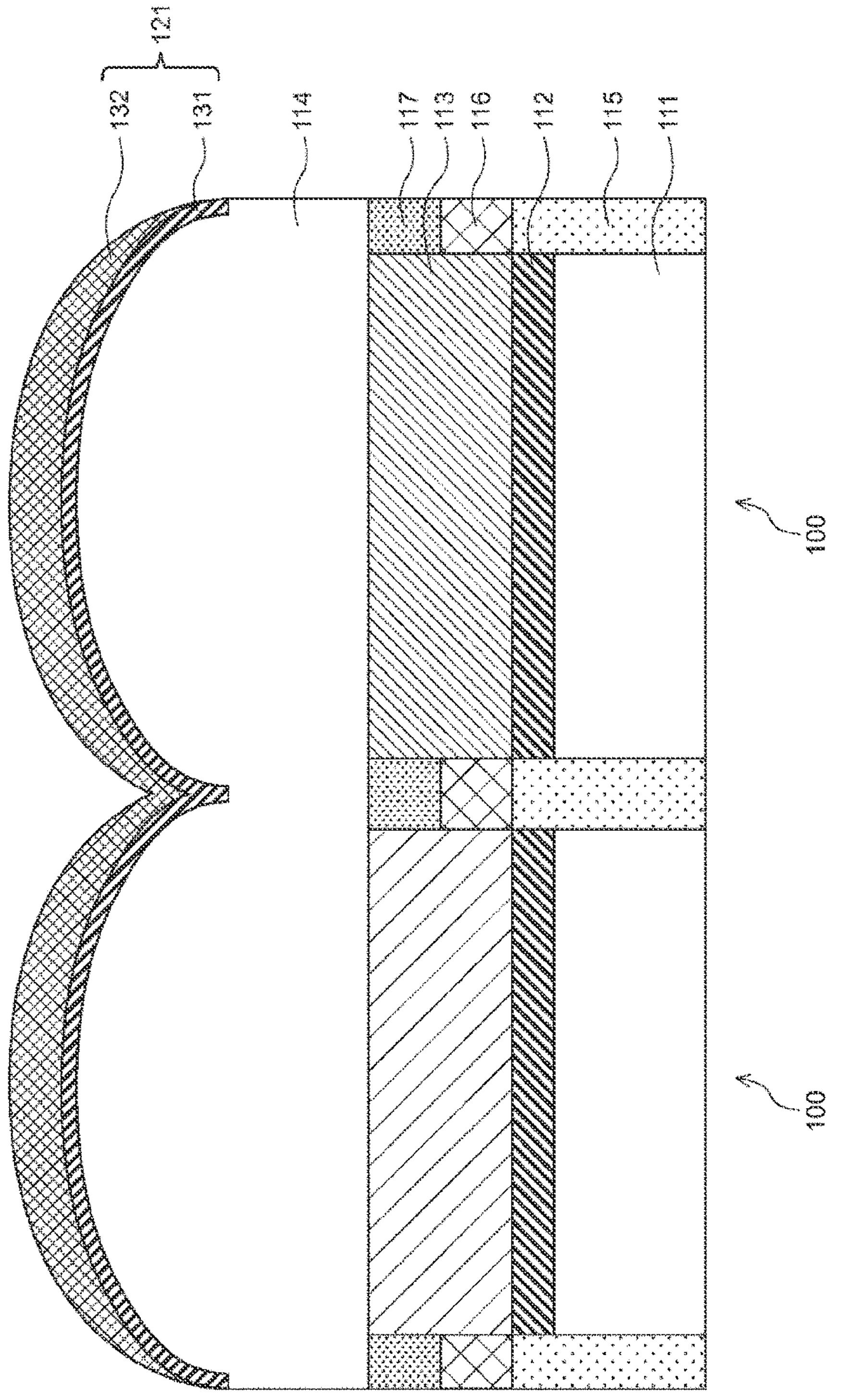
FIG. 2 is a diagram illustrating an example of a cross-sectional structure of a main part including pixels.

FIG. 2 is a diagram illustrating an example of a cross-sectional structure of a main part including the pixels 100. FIG. 2 illustrates a cross-sectional structure of two adjacent pixels among the plurality of pixels 100 arranged in the pixel array unit 21. Note that, in FIG. 2, a part of the photodiode and a structure body formed in a layer under the photodiode are omitted.

In FIG. 2, the pixel 100 has a photodiode 111 as a photoelectric conversion unit. The photodiode 111 is formed so that a first conductivity type well region formed on a semiconductor substrate such as a silicon substrate includes a first conductivity type semiconductor region and a second conductivity type semiconductor region. Here, for example, the first conductivity type is p-type, and the second conductivity type is n-type.

An insulating film 112 is formed on an upper surface of the photodiode 111, and a color filter 113 and an on-chip microlens 114 corresponding to each pixel 100 are stacked and formed on a flat surface of the insulating film 112.

As the color filters 113, for example, color filters corresponding to red (R), green (G), and blue (B) wavelengths can be used. Furthermore, color filters corresponding to a Bayer array can be used as the color filters 113 formed in the plurality of pixels 100 two-dimensionally arranged in the pixel array unit 21. The on-chip microlens 114 is formed by, for example, an organic film.

An antireflection film 121 in which an inorganic film 131 and an inorganic film 132 are stacked is formed on a surface of the on-chip microlens 114. The inorganic film 131 is formed by a material having a refractive index higher than that of the on-chip microlens 114. The inorganic film 132 is formed by a material having a refractive index lower than those of the on-chip microlens 114 and the inorganic film 131.

When the refractive index of the inorganic film 131 is denoted by N1, N1≥1.8 holds, and a metal oxide film having high reliability is used as a film type. For example, as the film type of the inorganic film 131, a metal oxide film such as a tantalum oxide film ($Ta_2O_5$ film), a niobium oxide film ($Nb_2O_5$ film), a titanium oxide film ($TiO_2$ film), or a hafnium oxide film ($HfO_2$ film) is used.

When the refractive index of the inorganic film 132 is denoted by N2, N2≤1.55 holds. As the film type of the inorganic film 132, for example, a silicon dioxide film ($SiO_2$ film) or a silicon oxycarbide film (SiOC film) is used.

In the antireflection film 121, the inorganic film 131 has a higher refractive index than the inorganic film 132, and thus can be said to be a high refractive index layer. Furthermore, in the antireflection film 121, the inorganic film 132 has a lower refractive index than the inorganic film 131, and thus can be said to be a low refractive index layer. That is, in FIG. 2, the antireflection film 121 is constituted by a stacking of two layers: a high refractive index layer, which is the inorganic film 131; and a low refractive index layer, which is the inorganic film 132.

Note that, in FIG. 2, a light shielding film 116 and an insulating film 117 are stacked on a well region 115 between the photodiodes 111 of the pixels 100.

(Improvement in Reliability and Film Thinning)

As described previously, Patent Document 1 described above discloses a configuration in which a silicon nitride film (SiN film) is used as a high refractive index layer in an antireflection film. The inventors of the present disclosure have confirmed in a constant temperature and humidity test that in a case where a silicon nitride film is used for a high refractive index layer in an antireflection film, there is a possibility that the silicon nitride film is oxidized at an interface between an on-chip microlens and the silicon nitride film, and this may affect characteristics such as sensitivity characteristics.

Occurrence of such a reliability defect is caused by a change (decrease) in the refractive index due to oxidation of the silicon nitride film. As a countermeasure, it is assumed that a silicon nitride film having high moisture permeability is used, but such a silicon nitride film is difficult to be mass-produced, and it has been difficult to use a silicon nitride film as a high refractive index layer in an antireflection film. Furthermore, from a viewpoint of designing the film thickness of an antireflection film, in a case where the maximum film thickness of a high refractive index layer is 450 nm, particularly in a fine pixel, there is a concern that a quantum efficiency (QE) decreases due to an increase in the number of layers on an on-chip microlens.

On the other hand, in the solid-state imaging device 10 to which the present disclosure is applied, the inorganic film 131 formed by a metal oxide film such as a tantalum oxide film, a niobium oxide film, a titanium oxide film, or a hafnium oxide film is used as a high refractive index layer in the antireflection film 121 formed on the surface of the on-chip microlens 114. That is, since the film type used as the inorganic film 131 is a metal oxide film (e.g., tantalum oxide film) that has a characteristic that the refractive index hardly changes because the film is originally oxidized and is dense, the high refractive index layer in the antireflection film 121 has high reliability.

Furthermore, the metal oxide film (e.g., tantalum oxide film) used as the inorganic film 131 has a higher refractive index than a silicon nitride film, and thus the antireflection film 121 can be designed to be thinner (anti-reflection (AR) design). For example, the refractive index of a silicon nitride film is about 1.85, whereas the refractive index of a metal oxide film is about 2 to 2.5.

Figure 3:
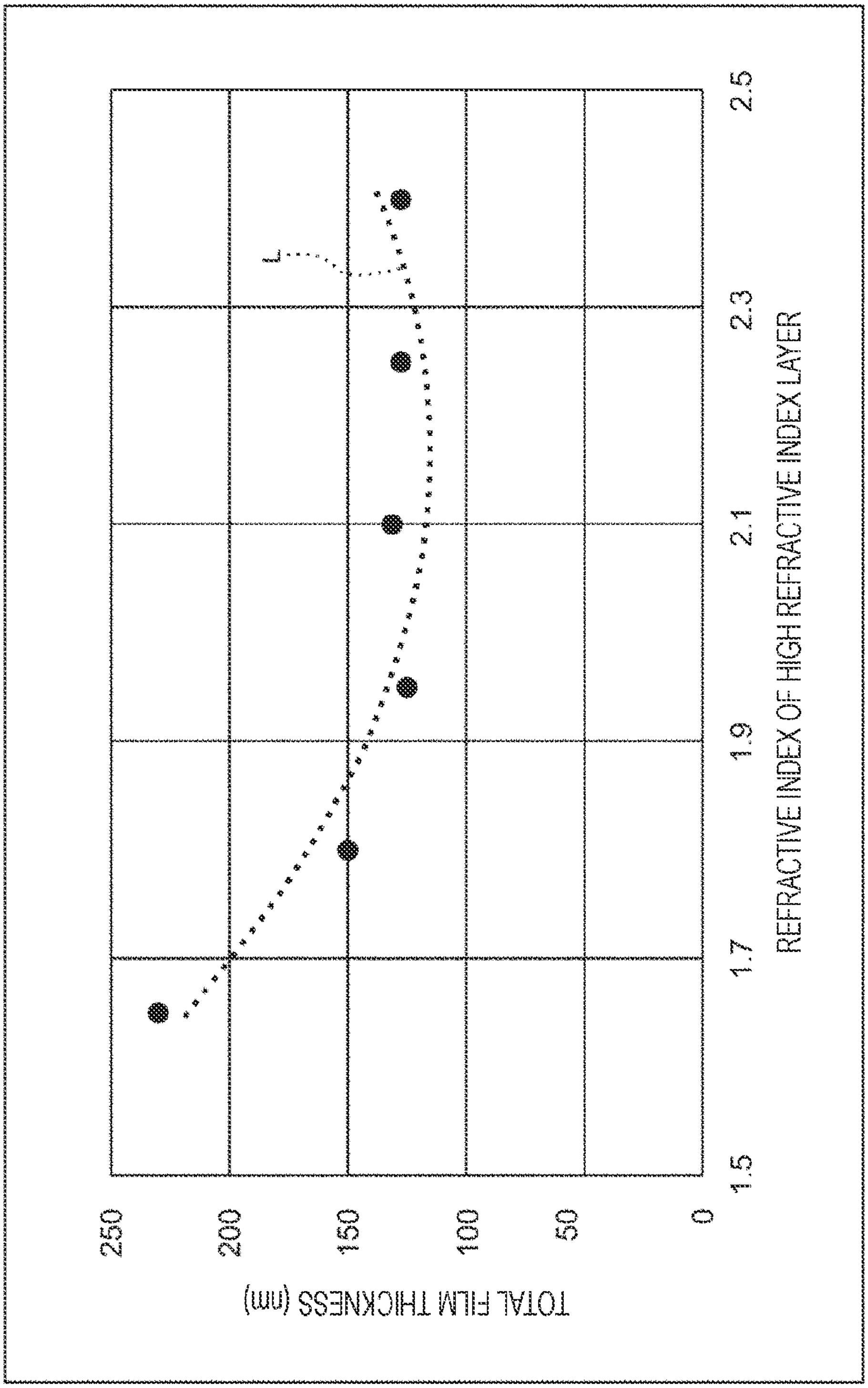
FIG. 3 is a diagram illustrating a relationship between a refractive index of a high refractive index layer and an optimally designed total film thickness.

FIG. 3 shows the refractive index of the high refractive index layer on a horizontal axis and an optimally designed film thickness (total film thickness) of the antireflection film on a vertical axis, and the relationship between the refractive index of the high refractive index layer and the total film thickness is represented by a curve L. In the solid-state imaging device 10 to which the present disclosure is applied, the refractive index of the high refractive index layer corresponds to the refractive index of the inorganic film 131, and the total film thickness corresponds to the film thickness of the antireflection film 121.

As indicated by the curve L in FIG. 3, the lower the refractive index of the high refractive index layer, the greater the optimally designed total film thickness. Here, as the high refractive index layer, the refractive index of a silicon nitride film is about 1.85, whereas the refractive index of the metal oxide film forming the inorganic film 131 is about 2 to 2.5, and it is possible to perform AR design so that the antireflection film 121 becomes thinner.

That is, in the solid-state imaging device 10 to which the present disclosure is applied, a metal oxide film is used as the inorganic film 131, which is a high refractive index layer, in a combination of a high refractive index layer and a low refractive index layer so that the refractive index can be increased as compared with a case of using a silicon nitride film, and it is therefore possible to obtain the same optical path length as in the case of using a silicon nitride film even in a case where AR design with a smaller film thickness is performed, and thus film thinning can be achieved.

It is known that, particularly in a fine pixel, a light collection efficiency significantly changes in accordance with the distance between a top position (central portion) of the on-chip microlens and the silicon substrate. When the film thickness (total film thickness) of the antireflection film is greater, the distance from the silicon substrate to the top position of the on-chip microlens increases. With this arrangement, the light collection efficiency is lowered, and as a result, the quantum efficiency (QE) is decreased, and it is therefore necessary to make the antireflection film thinner. In the solid-state imaging device 10 to which the present disclosure is applied, the antireflection film 121 formed on the surface of the on-chip microlens 114 can be made thinner, and this allows for suppressing a decrease in quantum efficiency (QE) in fine pixels.

Here, in the AR design, the film thickness of the inorganic film 131 as a high refractive index layer is set to be equal to or smaller than the film thickness of the inorganic film 132 as a low refractive index layer. That is, when the film thickness of the inorganic film 131 is denoted by T1 and the film thickness of the inorganic film 132 is denoted by T2, design is performed so that the relationship is expressed by $T1 \leq T2$.

Furthermore, in consideration of an influence on characteristics of the quantum efficiency (QE) in fine pixels described above, the AR design is performed such that the film thickness (total film thickness) of the antireflection film 121 is 200 nm or less. The inventors of the present disclosure have performed detailed simulations and confirmed that using a metal oxide film instead of a silicon nitride film as a high refractive index layer in an antireflection film allows for a reduction in total film thickness by approximately 100 nm, and allows for AR design with the total film thickness of 200 nm or less.

As described above, in the solid-state imaging device 10 to which the present disclosure is applied, a metal oxide film such as a tantalum oxide film is used as a high refractive index layer in the antireflection film 121 formed on the surface of the on-chip microlens 114, and this makes it possible to further improve the reliability and perform AR design with a smaller film thickness.

(Number of Layers of Antireflection Film)

The above description shows a case where the antireflection film 121 is constituted by two layers in which a high refractive index layer and a low refractive index layer are stacked, but the number of layers by which the antireflection film 121 is formed is not limited to two layers, and may be, for example, four layers in which high refractive index layers and low refractive index layers are alternately stacked.

Figure 4:
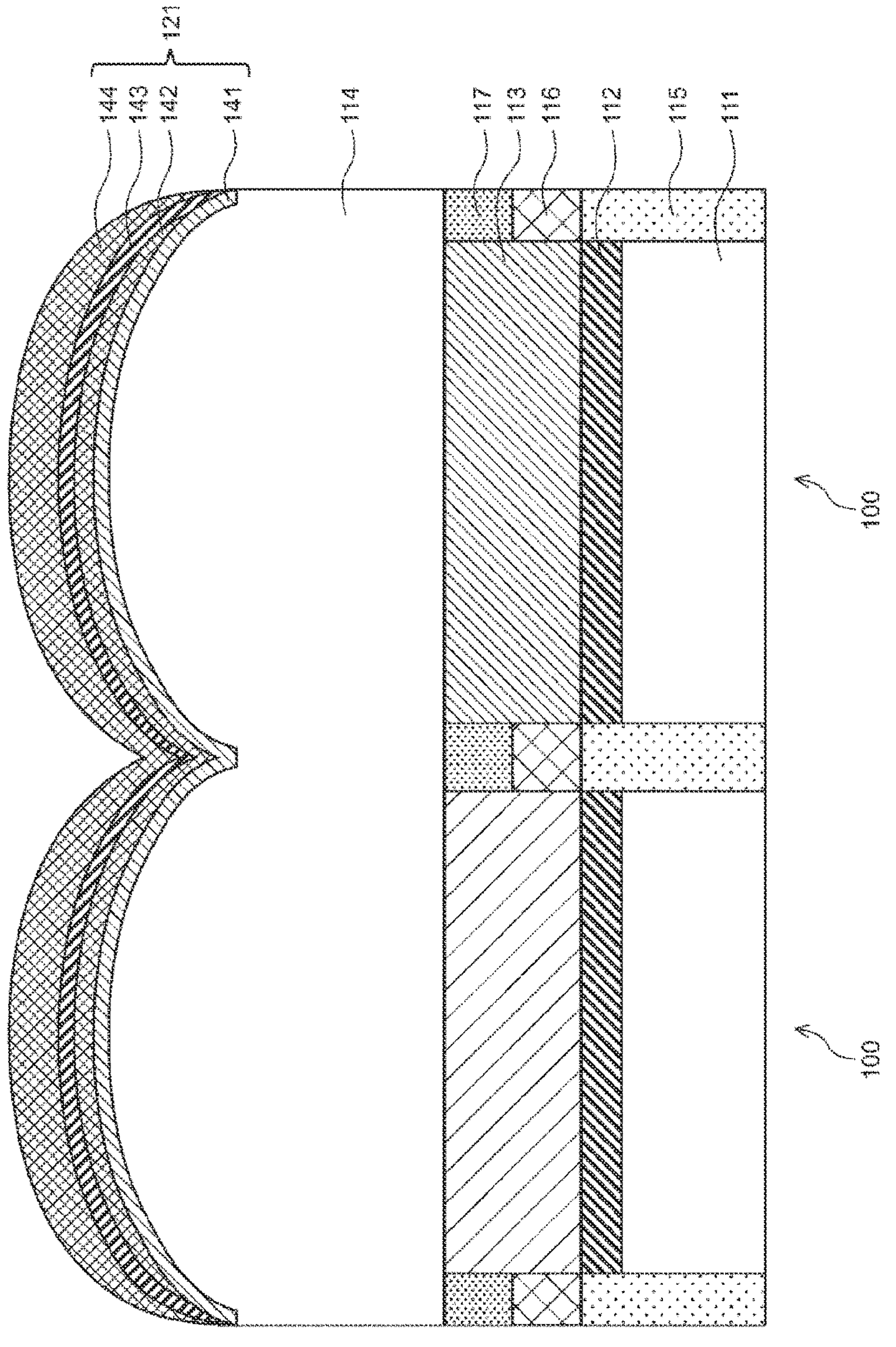
FIG. 4 is a diagram illustrating an example of a cross-sectional structure of a main part of the pixels in a case where the number of layers of an antireflection film is four.

FIG. 4 is a diagram illustrating an example of a cross-sectional structure of a main part of the pixels 100 in a case where the number of layers of the antireflection film 121 is four. In FIG. 4, portions corresponding to those in FIG. 2 are denoted by the same reference numerals, and the description thereof will be omitted as appropriate.

In FIG. 4, the antireflection film 121 is formed by a stacking of an inorganic film 141, an inorganic film 142, an inorganic film 143, and an inorganic film 144. In the antireflection film 121, the inorganic film 141 and the inorganic film 143 are high refractive index layers, and the inorganic film 142 and the inorganic film 144 are low refractive index layers, in which the high refractive index layers and the low refractive index layers are alternately stacked.

Similarly to the inorganic film 131 (FIG. 2), a metal oxide film such as a tantalum oxide film, a niobium oxide film, a titanium oxide film, or a hafnium oxide film is used as the film type of the inorganic film 141 and the inorganic film 143. The inorganic film 141 and the inorganic film 143 may be of the same film type or different film types. When the refractive index of each of the inorganic film 141 and the inorganic film 143 is denoted by N1, $N1 \geq 1.8$ holds.

Similarly to the inorganic film 132 (FIG. 2), a silicon dioxide film, a silicon oxycarbide film, or the like is used as the inorganic film 142 and the inorganic film 144. The inorganic film 142 and the inorganic film 144 may be of the same film type or different film types. When the refractive index of each of the inorganic film 142 and the inorganic film 144 is denoted by N2, $N2 \leq 1.55$ holds.

The antireflection film 121 includes high refractive index layers (inorganic films 141 and 143) and low refractive index layers (inorganic films 142 and 144) that are alternately stacked, in which a high refractive index layer (inorganic film 141) is formed on the surface of (directly on) the on-chip microlens 114, and the low refractive index layers (inorganic films 142 and 144) are formed on the surfaces of the high refractive index layers (inorganic films 141 and 143). Furthermore, in the antireflection film 121, a low refractive index layer (inorganic film 144) is formed at the outermost surface.

Figure 5:
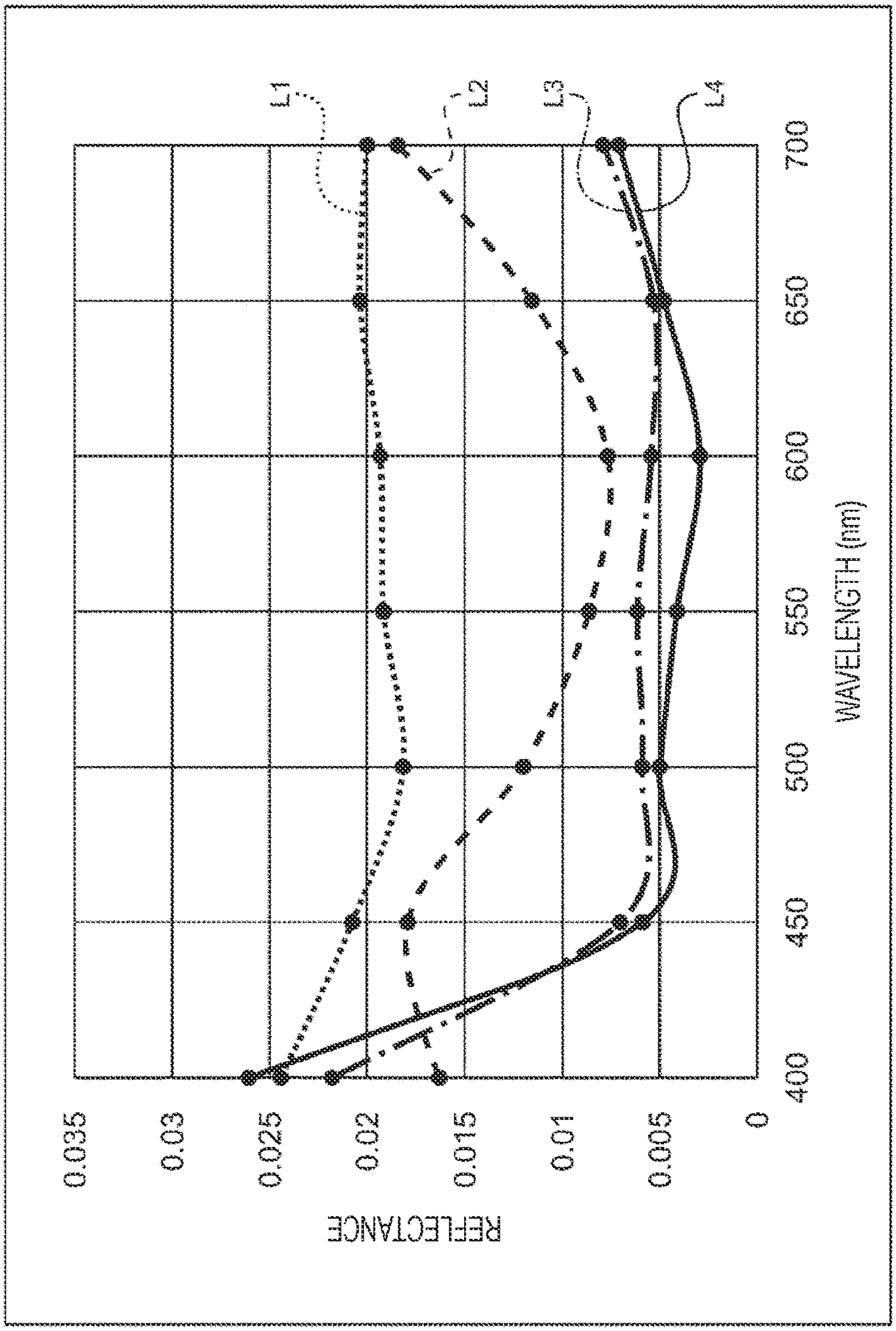
FIG. 5 is a diagram illustrating a relationship between the number of layers of the antireflection film and a reflectance.

FIG. 5 shows the wavelength on the horizontal axis and the reflectance on the vertical axis, and the relationship between the number of layers of the antireflection film 121 and the reflectance is represented by curves L1 to L4. In FIG. 5, the relationship in a case where the number of layers in the antireflection film 121 is one is represented by the curve L1, the relationship in a case where the number of layers is two is represented by the curve L2, the relationship in a case where the number of layers is three is represented by the curve L3, and the relationship in a case where the number of layers is four is represented by the curve L4.

As indicated by the curves L1 to L4 in FIG. 5, it is possible to further reduce the reflectance by increasing the number of layers in the antireflection film 121. For example, in a case where the number of layers of the antireflection film 121 is four, the reflectance decreases even in the same wavelength region as compared with a case where the number of layers is one to three.

As described above, in the solid-state imaging device 10 to which the present disclosure is applied, by alternately stacking high refractive index layers and low refractive index layers to increase the number of layers to four or the like as the antireflection film 121 formed on the surface of the on-chip microlens 114, it is possible to further suppress surface reflection from the on-chip microlens 114 and to suppress image quality deterioration such as flare.

Note that FIG. 4 illustrates a configuration in which high refractive index layers and low refractive index layers are alternately stacked in four layers as the antireflection film 121, but the number of layers may be larger than four as long as the requirements of the AR design described above are satisfied. For example, in a case of a stacking of six layers, the fifth layer is a high refractive index layer, and the sixth layer is a low refractive index layer, which serves as an outermost surface.

(Coverage of Antireflection Film)

As for coverage of the antireflection film 121, it is desirable that neither the high refractive index layers nor the low refractive index layers be conformal. For example, the antireflection film 121 has a film thickness that is smaller at a portion corresponding to an edge portion (bottom position) of the on-chip microlens 114 than at a portion corresponding to a central portion (top position) of the on-chip microlens 114. Furthermore, the film thickness of the antireflection film 121 becomes smaller from the portion corresponding to the central portion of the on-chip microlens 114 to the portion corresponding to the edge portion.

Figure 6:
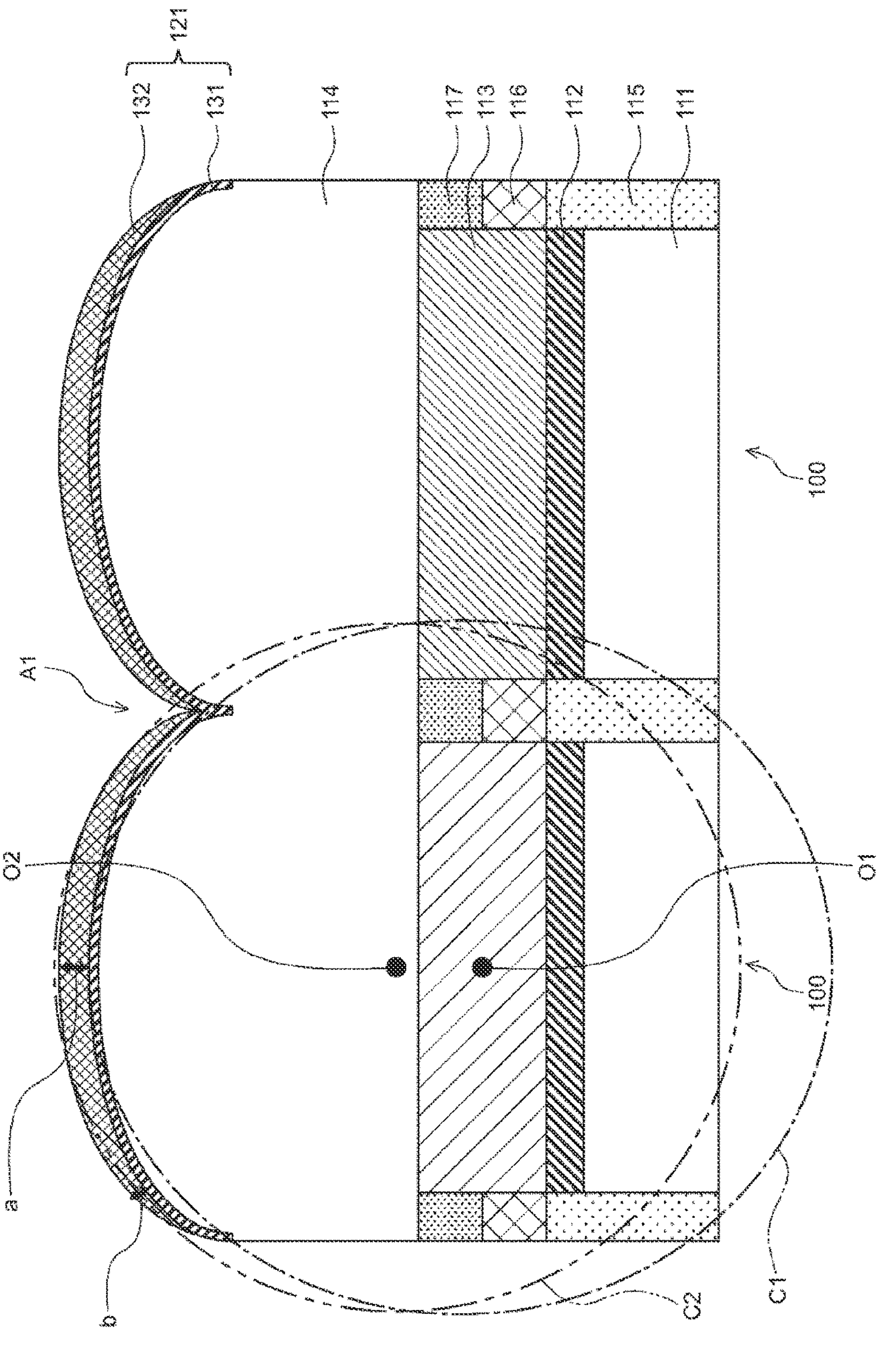
FIG. 6 is a diagram illustrating a relationship between the center of a circle indicating a curvature of a surface of an on-chip microlens and the center of a circle indicating a curvature of a surface of the antireflection film.

FIG. 6 is a diagram illustrating a relationship between the center of a circle indicating a curvature of the surface of the on-chip microlens 114 and the center of a circle indicating a curvature of the surface of the antireflection film 121. In FIG. 6, portions corresponding to those in FIG. 2 are denoted by the same reference numerals, and the description thereof will be omitted.

In FIG. 6, a circle C1 indicating the curvature of the surface of the on-chip microlens 114 is represented by a dashed-dotted line, and a circle C2 indicating the curvature of the surface of the antireflection film 121 is represented by a dashed-two dotted line. Furthermore, the relationship between a center O1 of the circle C1 and a center O2 of the circle C2 is illustrated.

Here, in a case where the antireflection film 121 is formed conformally, the position of the center O1 of the circle C1 and the position of the center O2 of the circle C2 coincide with each other. That is, although not illustrated, in a case where the antireflection film 121 is formed conformally, the film thickness becomes uniform, and the film thickness is the same at the portion corresponding to the central portion and at the portion corresponding to the edge portion of the on-chip microlens 114.

However, in order to enhance the characteristics, it is desirable that the film thickness of the antireflection film 121 be smaller in the vicinity of the edge portion of the on-chip microlens 114. Therefore, in the solid-state imaging device 10 to which the present disclosure is applied, as illustrated in FIG. 6, the center O2 of the circle C2 indicating the curvature of the surface of the antireflection film 121 is positioned on the light incident side (upper side in the drawing) with respect to the center O1 of the circle C1 indicating the curvature of the surface of the on-chip microlens 114.

With this arrangement, in (the inorganic film 132 of) the antireflection film 121, a film thickness b at the portion corresponding to the edge portion of the on-chip microlens 114 is smaller than a film thickness a at the portion corresponding to the central portion of the on-chip microlens 114 (the relationship is expressed by a>b).

As described above, in the solid-state imaging device 10 to which the present disclosure is applied, the center O2 of the circle C2 is positioned on the light incident side (upper side in the drawing) with respect to the center O1 of the circle C1 (the positions of the center O1 of the circle C1 and the center O2 of the circle C2 do not coincide with each other), and the antireflection film 121 formed on the surface of the on-chip microlens 114 is not conformally formed.

That is, in the antireflection film 121 in which the inorganic film 131 as a high refractive index layer and the inorganic film 132 as a low refractive index layer are stacked, neither the inorganic film 131 nor the inorganic film 132 is conformal, and the center of a circle indicating the curvature of the surface of each of the inorganic film 131 and the inorganic film 132 is positioned on the light incident side with respect to the center O1 of the circle C1. Thus, in the antireflection film 121 formed on the surface of the on-chip microlens 114, the film thickness on the edge portion side is smaller than the film thickness at the central portion, and characteristics such as sensitivity characteristics can be enhanced as compared with a case where the film thickness is uniform.

Note that, in FIG. 4 described above, the antireflection film 121 includes high refractive index layers (inorganic films 141 and 143) and low refractive index layers (inorganic films 142 and 144) that are alternately stacked to form four layers, and it is preferable that none of the inorganic films 141 to 144 be conformal, and that the center of the circle indicating the curvature of the surface of each of the inorganic films 141 to 144 be positioned on the light incident side with respect to the center O1 of the circle C1.

In FIG. 6, a recess A1 (gap portion between the on-chip microlenses 114), which is a V-shaped recessed region, is formed between the on-chip microlenses 114 that are formed in such a way as to correspond to the individual pixels 100. The antireflection film 121 is formed also in the recess A1, so that the antireflection film 121 seamlessly covers all the on-chip microlenses 114.

The region between the on-chip microlenses 114 is not limited to a V-shaped recessed region, and may be a flat region. For example, in a case where the on-chip microlenses 114 are placed at predetermined intervals as illustrated in a planar layout in FIG. 7, a region between the on-chip microlenses 114 is flat.

Figure 7:
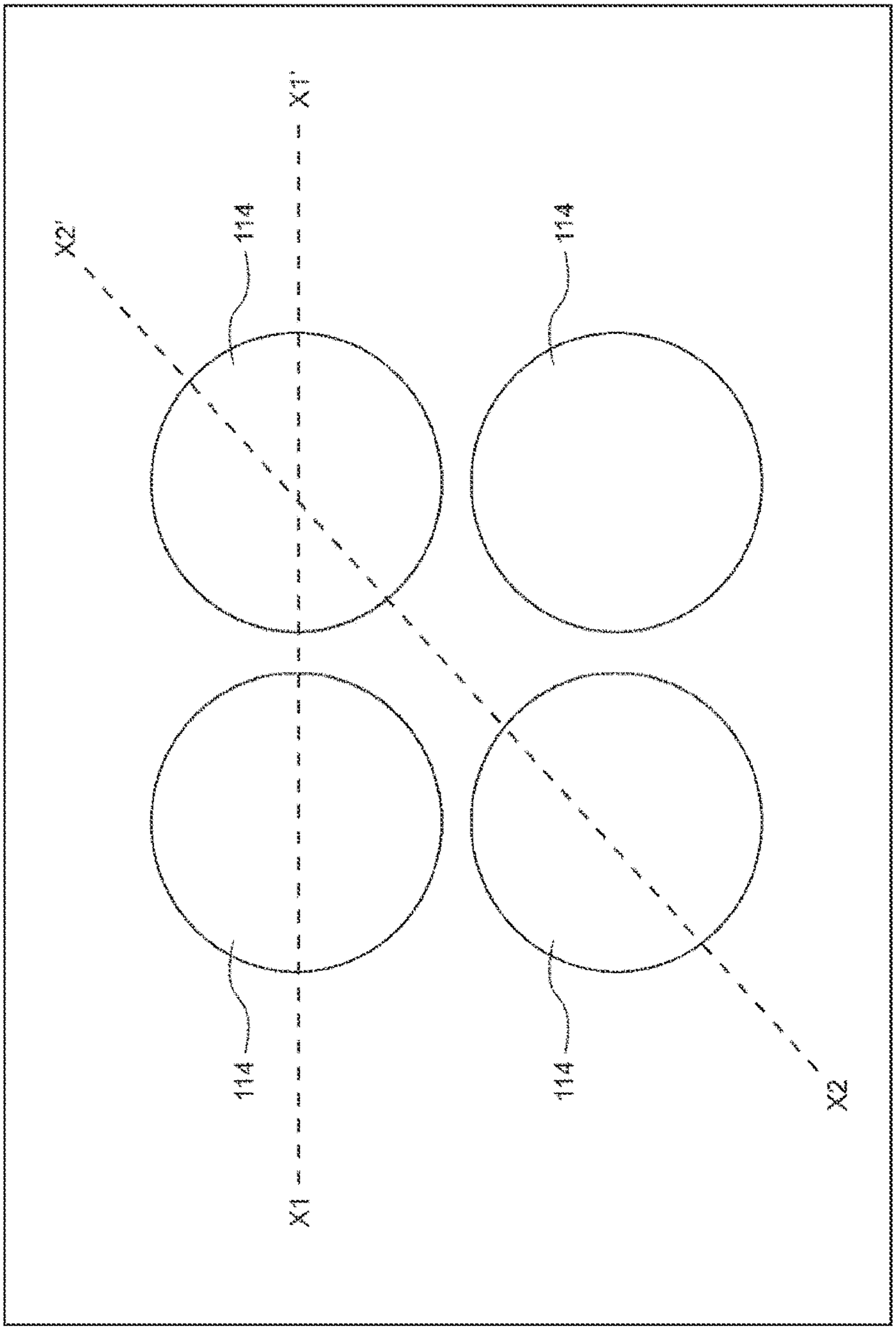
FIG. 7 is a diagram illustrating an example of a planar layout in a case where a flat surface is interposed between the on-chip microlenses.
Figure 8:
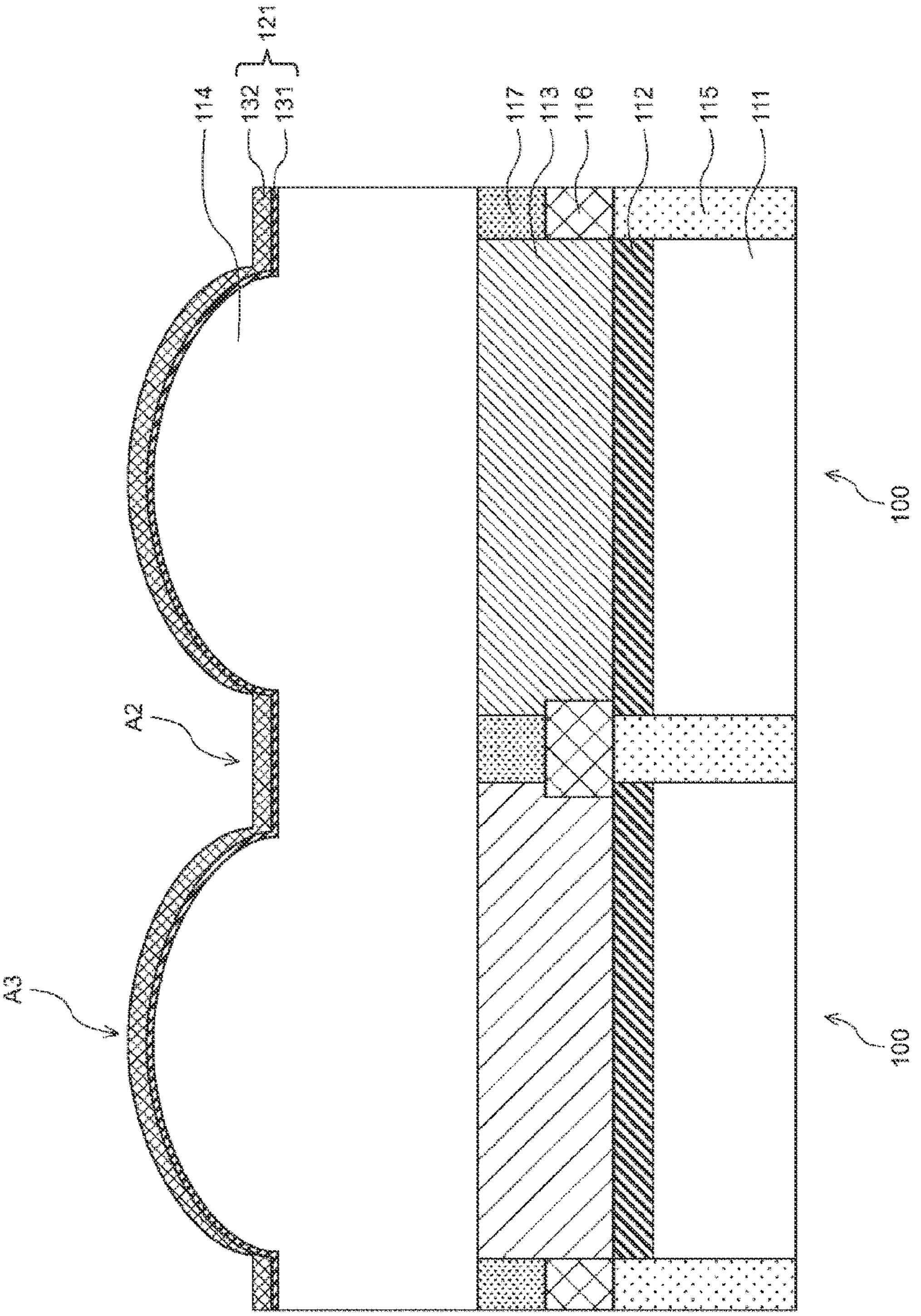
FIG. 8 is a diagram illustrating an example of the cross-sectional structure of the main part of the pixels in a case where the flat surface is interposed between the on-chip microlenses.

FIG. 8 illustrates an X1-X1' cross section of the planar layout in FIG. 7. In FIG. 8, portions corresponding to those in FIG. 2 are denoted by the same reference numerals, and the description thereof will be omitted as appropriate.

In FIG. 8, focusing on a flat portion A2, which is a flat region between the on-chip microlenses 114, and a central portion A3 of the on-chip microlens 114, the film thickness of the antireflection film 121 is substantially the same at a portion corresponding to the flat portion A2 and at a portion corresponding to the central portion A3. With this arrangement, it is possible to reduce the reflectance in the flat portion A2 as in the AR design, and this function is effective also for light incident between the on-chip microlenses 114. As a result, image quality deterioration such as flare can be suppressed.

Note that FIG. 8 also corresponds to an X2-X2' cross section of the planar layout in FIG. 7, and the film thickness of the antireflection film 121 is substantially the same at the portion corresponding to the flat portion A2 between the on-chip microlenses 114 and at the portion corresponding to the central portion A3 of the on-chip microlens 114 not only in a case of the pixels 100 adjacent in a left and right direction or an up and down direction but also in a case of the pixels 100 adjacent in an oblique direction, and a similar effect can be obtained.

Example of Manufacturing Method

Figure 9:
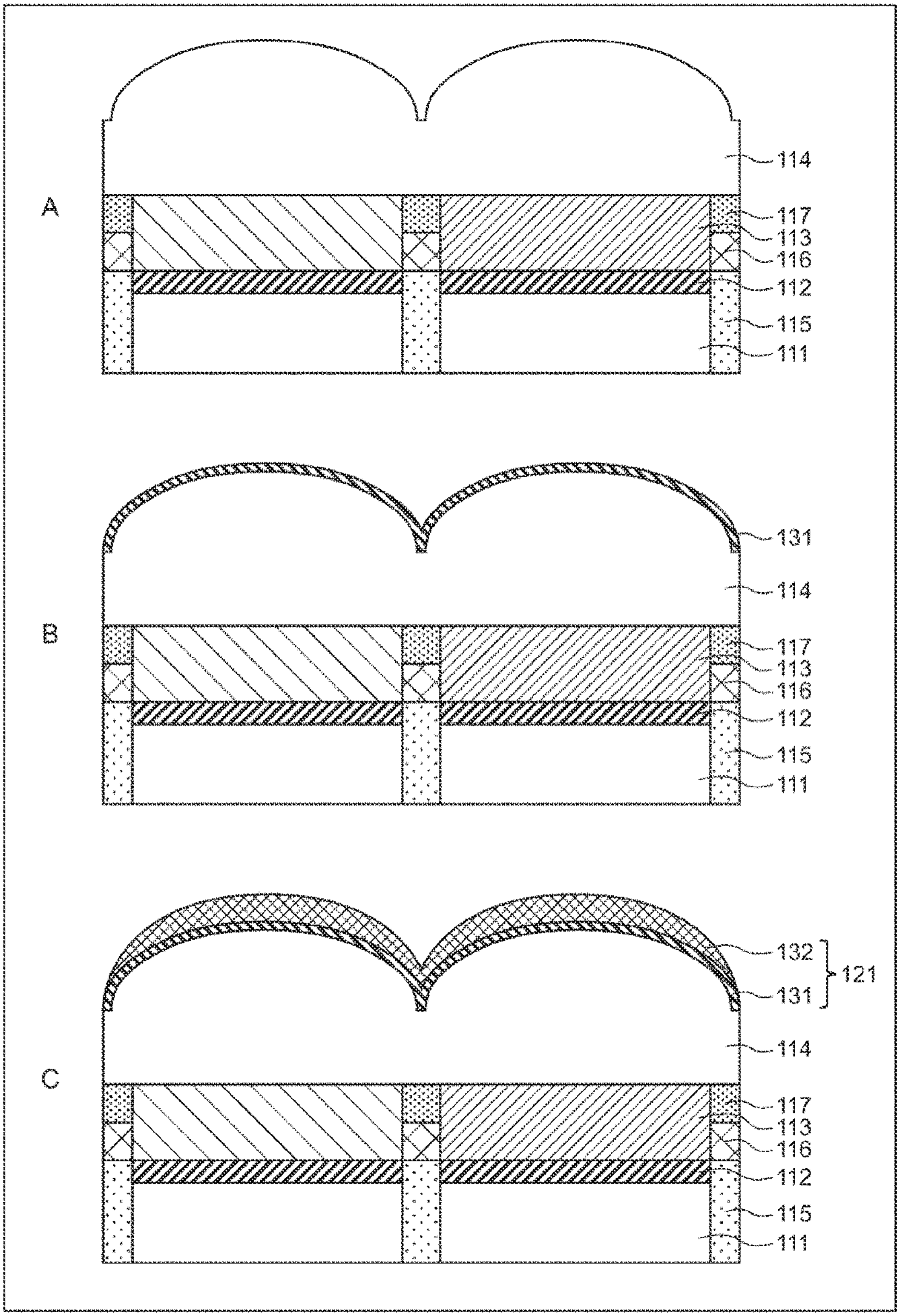
FIG. 9 is a diagram illustrating an example of a method of manufacturing the photodetection device to which the present disclosure is applied.

FIG. 9 is a diagram illustrating an example of a method of manufacturing the photodetection device to which the present disclosure is applied.

FIG. 9 illustrates steps performed after the on-chip microlens 114 is formed. That is, although not illustrated, an imaging region is formed on a silicon substrate, in which the photodiodes 111 and the like are formed so that the plurality of pixels 100 is two-dimensionally arranged. Furthermore, the insulating films 112 are formed on the upper surfaces of the photodiodes 111 and the surfaces are made flat, and the color filters 113, each of which corresponds to a red, green, or blue wavelength, are formed thereon.

Then, as illustrated in A of FIG. 9, the on-chip microlenses 114 are formed on the color filters 113.

Next, as illustrated in B of FIG. 9, the inorganic film 131 is formed on the surface of the on-chip microlens 114. The inorganic film 131 can be formed by using a chemical vapor deposition (CVD) method, a physical vapor deposition (PVD) method, an atomic layer deposition (ALD) method, or the like. As the inorganic film 131, for example, a metal oxide film such as a tantalum oxide film, a niobium oxide film, a titanium oxide film, or a hafnium oxide film is formed.

Next, as illustrated in C of FIG. 9, the inorganic film 132 is formed on the surface of the inorganic film 131. The inorganic film 132 can be formed by using the chemical vapor deposition method, the physical vapor deposition method, the atomic layer deposition method, or the like. As the inorganic film 132, for example, a silicon dioxide film or a silicon oxycarbide film is formed.

Here, the antireflection film 121 in which the inorganic film 131 and the inorganic film 132 are stacked is not conformal, and the film is formed so that the center of the circle indicating the curvature of the surface of each of the inorganic film 131 and the inorganic film 132 is positioned on the light incident side (upper side in the drawing) with respect to the center of the circle indicating the curvature of the surface of the on-chip microlens 114.

In this way, the solid-state imaging device 10 is obtained, in which the antireflection film 121 (FIG. 2) constituted by two layers, the inorganic film 131 and the inorganic film 132 (two layers constituted by a high refractive index layer and a low refractive index layer), is formed on the surface of the on-chip microlens 114.

Note that, while FIG. 9 illustrates the manufacturing method in a case where the antireflection film 121 is constituted by two layers, a similar manufacturing method can be used also in a case where the antireflection film 121 is constituted by four layers or the like. That is, by repeating the steps illustrated in B and C of FIG. 9, the inorganic film 141, the inorganic film 142, the inorganic film 143, and the inorganic film 144 are formed in this order by the chemical vapor deposition method, the physical vapor deposition method, the atomic layer deposition method, or the like, and thus the solid-state imaging device 10 having the on-chip microlenses 114 on which the antireflection film 121 (FIG. 4) constituted by four layers, which are high refractive index layers and low refractive index layers alternately stacked, is formed is obtained.

2. Second Embodiment

Meanwhile, in a solid-state imaging device having on-chip microlenses, a configuration is known in which an antireflection structure body having a fine uneven shape for reducing reflection of light in a wavelength region used is formed on the surfaces of the on-chip microlenses (see, for example, Document A below).

Document A: Japanese Patent Application Laid-Open No. 2006-332433

In the case of the configuration in which the antireflection structure body having the fine uneven shape is formed on the surfaces of the on-chip microlenses, the antireflection structure body is formed directly on the on-chip microlenses, and this poses a problem in adhesion with the on-chip microlenses, and the antireflection structure body may peel off. Furthermore, it is assumed to improve adhesion by plasma treatment. However, in a case where plasma treatment is performed, improvement of adhesion can be expected, but a new problem of deterioration in optical characteristics occurs.

Figure 10:
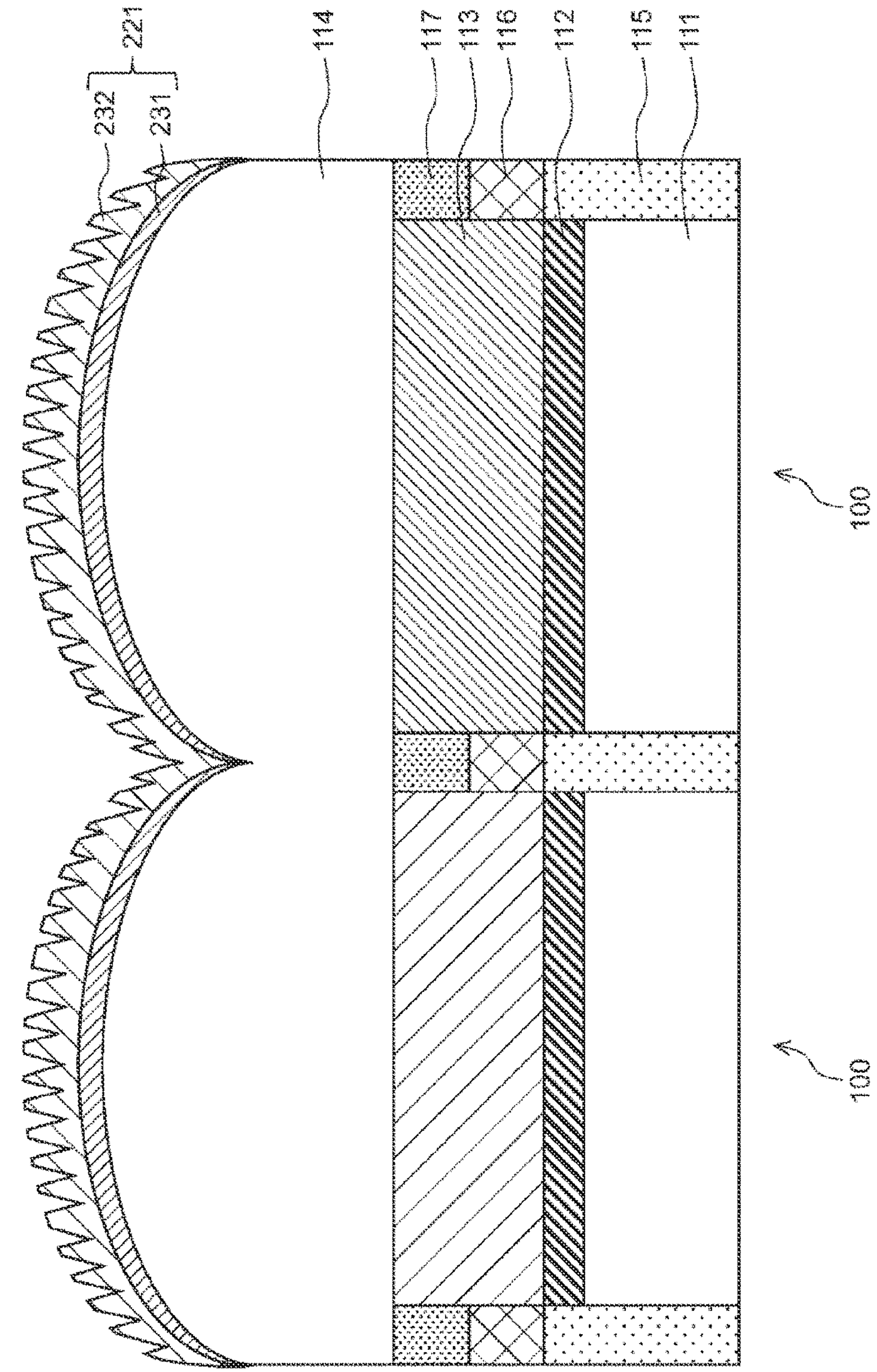
FIG. 10 is a diagram illustrating another example of the cross-sectional structure of the main part including the pixels.

In order to improve these problems, a solid-state imaging device 10 to which the present disclosure is applied adopts a configuration of an antireflection film as illustrated in FIG. 10, thereby allowing for a suppression of image quality deterioration such as flare, while improving adhesion between the antireflection film including a structural film having a fine uneven shape and the on-chip microlenses and having high reliability.

(Another Configuration of Antireflection Film)

FIG. 10 is a diagram illustrating another example of the cross-sectional structure of the main part including the pixels 100. In FIG. 10, portions corresponding to those in FIG. 2 are denoted by the same reference numerals, and the description thereof will be omitted as appropriate.

When the cross-sectional structure in FIG. 10 is compared with the cross-sectional structure in FIG. 2, instead of the antireflection film 121, an antireflection film 221 is formed on a surface of an on-chip microlens 114. The antireflection film 221 is formed by a stacking of an inorganic film 231 and an inorganic film 232. The inorganic film 231 is formed by a material having a refractive index higher than that of the on-chip microlens 114. The inorganic film 232 is formed by a material having a refractive index lower than those of the on-chip microlens 114 and the inorganic film 231.

The inorganic film 231 is an adhesion film (adhesion layer) for improving adhesion between the on-chip microlens 114 and the inorganic film 232. When the refractive index of the inorganic film 231 is denoted by N3, for example, N3≤1.55 holds. As the film type of the inorganic film 231, for example, a low temperature oxidation (LTO) film such as a silicon dioxide film ($SiO_2$ film) is used.

The inorganic film 232 is a structural film having a moth-eye structure in which a fine uneven shape is formed. The inorganic film 232 has the fine uneven shape, and this allows for a reduction of reflection of light in a wavelength region used. When the refractive index of the inorganic film 232 is denoted by N4, for example, N4≤1.4 holds.

For example, in a case where an AlOx film is used as the film type of the inorganic film 232, processing treatment such as high-temperature treatment (e.g., treatment at 90° C.) with de-ionized water (DIW) is performed after the AlOx film is formed, and thus a fine uneven shape is formed on the surface of the AlOx film. At this time, the refractive index of the AlOx film is approximately 1.6, but air layers formed in recesses due to the fine uneven shape cause the refractive index to decrease to approximately 1.3 on the whole.

The film thickness of the inorganic film 232 can be, for example, approximately 270 nm between the top and the bottom. Here, the top position is the position of the highest protrusion in the fine uneven shape, and the bottom position is the position of the interface with the inorganic film 231. In the antireflection film 221, the inorganic film 232 is a structural film having a fine uneven shape, but the inorganic film 231 as an adhesion film is not exposed, and the outermost surface is the inorganic film 232.

In the antireflection film 221, the inorganic film 231 has a refractive index approximately the same as that of the inorganic film 132, and thus can be said to be a low refractive index layer. Furthermore, in the antireflection film 221, the inorganic film 232 has a lower refractive index than the inorganic film 231, thus can be said to be an ultra-low refractive index layer having a refractive index further lower than that of the low refractive index layer.

That is, while the above description shows a case where high refractive index layers and low refractive index layers are alternately stacked as the antireflection film 121, another layer may be stacked as long as the antireflection film has a structure in which a first layer and a second layer having a lower refractive index than the first layer are stacked. For example, as illustrated in FIG. 10, the antireflection film 221 may be constituted by a stacking of two layers: a low refractive index layer, which is the inorganic film 231; and an ultra-low refractive index layer, which is the inorganic film 232. Alternatively, the inorganic film 232 can also be said to be a structural film formed by processing the surface of a film to be processed having a predetermined refractive index (e.g., an AlOx film having a refractive index of 1.6) into a fine uneven shape.

(Improvements)

Figure 11:
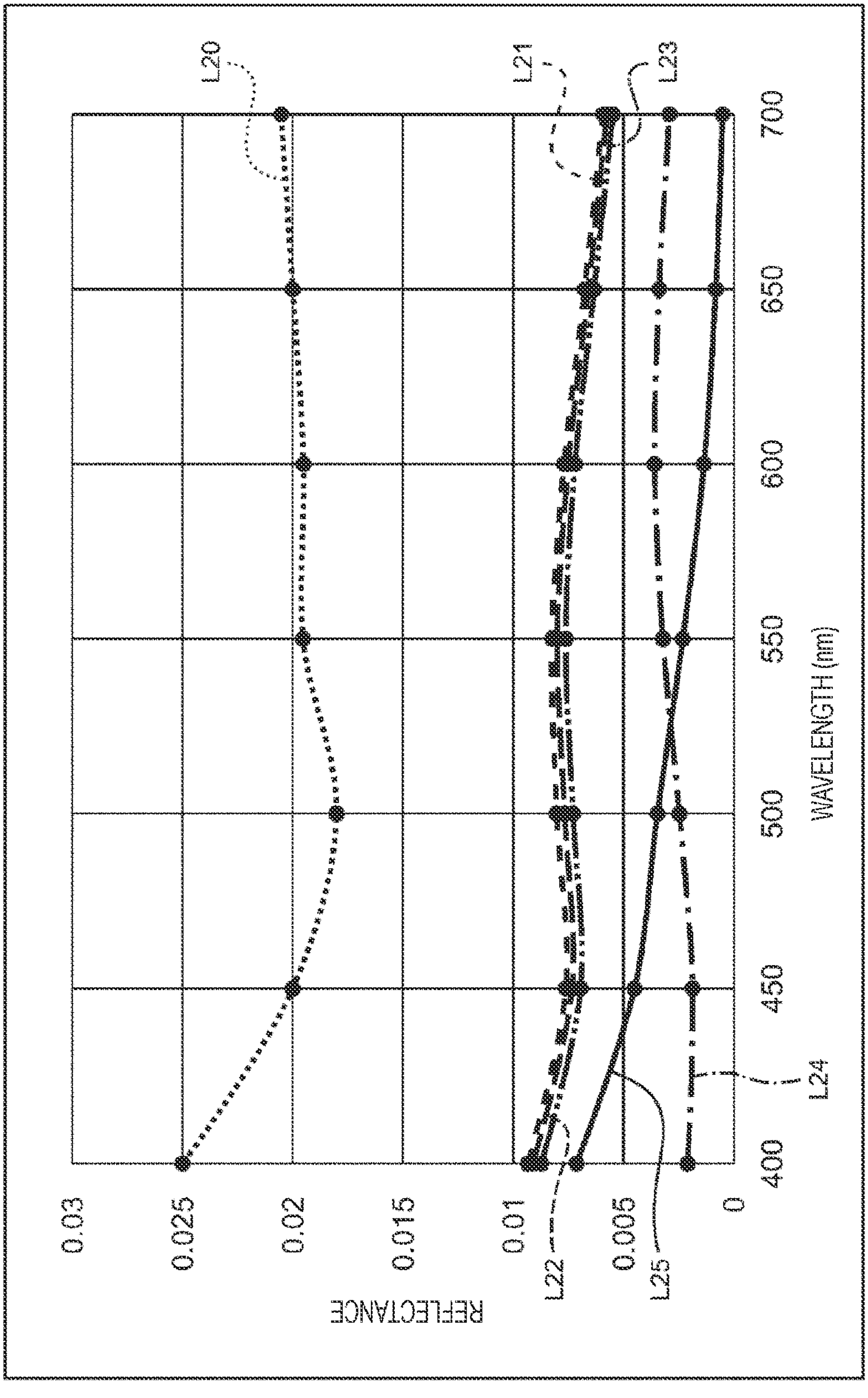
FIG. 11 is a diagram illustrating a relationship between the number of layers of an antireflection film and a reflectance.
Figure 12:
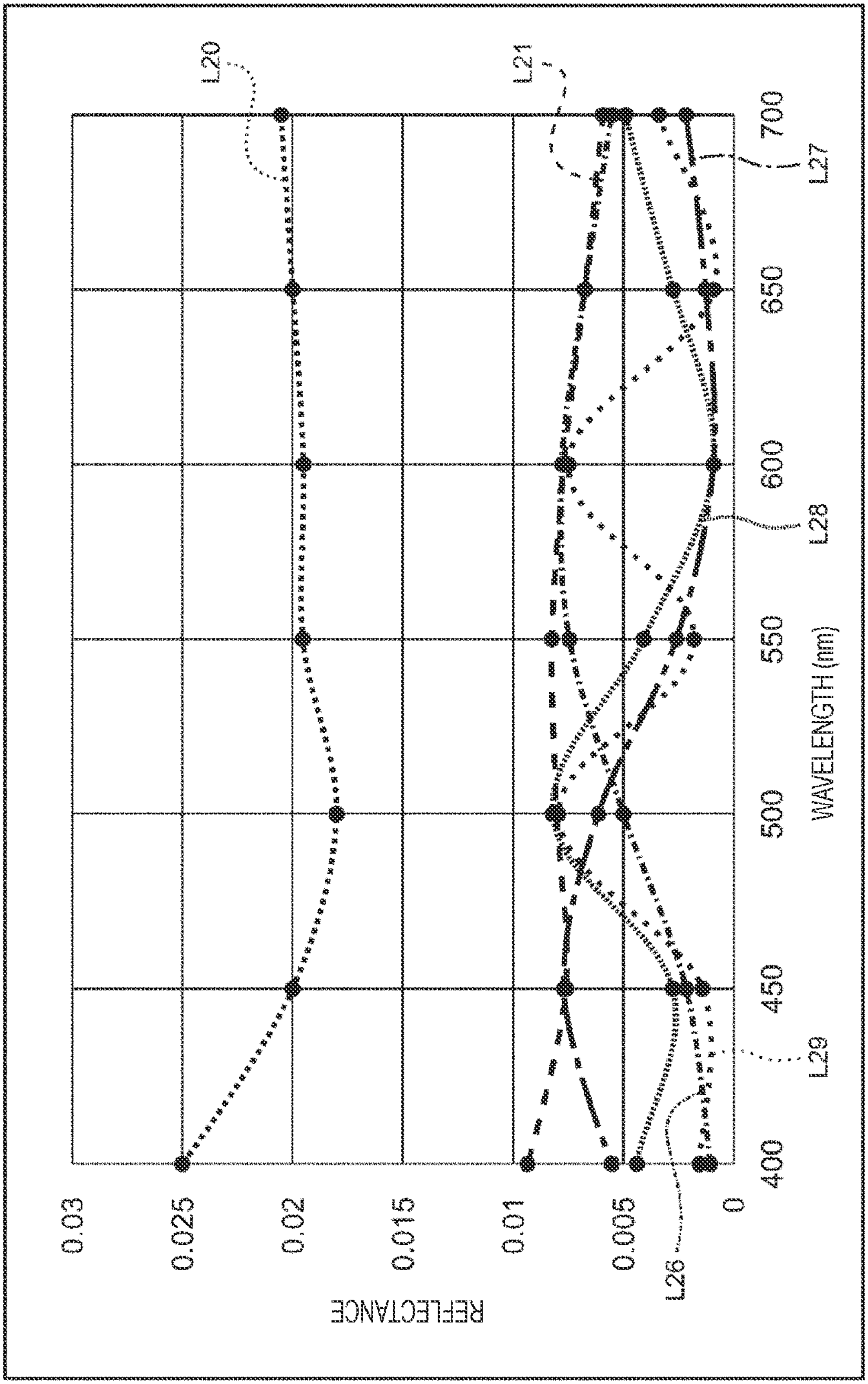
FIG. 12 is a diagram illustrating the relationship between the number of layers of the antireflection film and the reflectance.

FIGS. 11 and 12 show the wavelength on the horizontal axis and the reflectance on the vertical axis, and the relationship between the film thickness of the inorganic film 231 in the antireflection film 221 and the reflectance in the wavelength region is represented by curves L22 to L29. The film thickness of the inorganic film 231 can be a film thickness at a portion corresponding to the central portion (top position) of the on-chip microlens 114. In FIGS. 11 and 12, for comparison, the reflectance in the wavelength region in an assumed case in which the antireflection film 221 is constituted by the inorganic film 231 as a single film is represented by a curve L20, and the reflectance in the wavelength region in an assumed case in which the antireflection film 221 is constituted by the inorganic film 232 as a single film is represented by a curve L21.

In FIG. 11, in the antireflection film 221 in which the inorganic film 231 and the inorganic film 232 are stacked, the relationship when the film thickness of the inorganic film 231 is 5 nm is represented by the curve L22, the relationship when the film thickness of the inorganic film 231 is 10 nm is represented by the curve L23, the relationship when the film thickness of the inorganic film 231 is 50 nm is represented by the curve L24, and the relationship when the film thickness of the inorganic film 231 is 110 nm is represented by the curve L25.

Furthermore, in FIG. 12, in the antireflection film 221 in which the inorganic film 231 and the inorganic film 232 are stacked, the relationship when the film thickness of the inorganic film 231 is 200 nm is represented by the curve L26, the relationship when the film thickness of the inorganic film 231 is 300 nm is represented by the curve L27, the relationship when the film thickness of the inorganic film 231 is 500 nm is represented by the curve L28, and the relationship when the film thickness of the inorganic film 231 is 1000 nm is represented by the curve L29.

In FIG. 11, when the curve L22 is compared with the curve L20, the reflectance decreases by approximately 1%, and when the curve L22 is compared with the curve L21, the reflectance is approximately the same. While the reflectance of the curve L23 is slightly decreased as a whole than that of the curve L22, and the reflectances of the curves L24 and L25 are further decreased as a whole than that of the curve L23, the reflectances of the curves L23 to L25 do not exceed the reflectance of the curve L21. As described above, FIG. 11 shows that, when the film thickness of the inorganic film 231 is increased to 10 nm, 50 nm, or 110 nm, the reflectance is low in the wavelength region of 400 to 700 nm, and the reflectance is not degraded as compared with the case where the inorganic film 231 is not stacked (the case where the inorganic film 232 is a single film).

In FIG. 12, the reflectances of the curves L26 to L29 are lowered as a whole and do not exceed the reflectance of the curve L21. As described above, FIG. 12 shows that, when the film thickness of the inorganic film 231 is further increased to 200 nm, 300 nm, 500 nm, or 1000 nm, the reflectance is low in the wavelength region of 400 to 700 nm, and the reflectance is not degraded as compared with the case where the inorganic film 231 is not stacked (the case where the inorganic film 232 is a single film). However, the inventors of the present disclosure confirmed through detailed simulations that when the film thickness of the inorganic film 231 is 500 nm or 1000 nm, the reflectance is not degraded, but these thicknesses of the inorganic film 231 have influences such as occurrence of interference and are therefore not practical, and the film thickness of the inorganic film 231 is preferably 10 nm or more and 300 nm or less.

As described above, in the antireflection film 221 formed on the surface of the on-chip microlens 114, when the film thickness of the inorganic film 231 as an adhesion film between the on-chip microlens 114 and the inorganic film 232 is 10 to 300 nm, it is possible to suppress image quality deterioration such as flare while improving adhesion and having high reliability.

Specifically, the inorganic film 231, in which an LTO film such as a silicon dioxide film is used, has no problem in adhesion with the on-chip microlens 114 and no problem in adhesion with the inorganic film 232, and is therefore provided between the on-chip microlens 114 and the inorganic film 232 to improve adhesion. With this arrangement, the inorganic film 231 does not peel off from the on-chip microlens 114, and as a result, it is possible to suppress peeling of the inorganic film 232 at the outermost surface.

Furthermore, in the antireflection film 221, the inorganic film 231 and the inorganic film 232 are stacked, and the inorganic film 232 is a structural film having a fine uneven shape for reducing reflection of light. It is therefore possible to reduce surface reflection from the on-chip microlens 114 and suppress flare caused by reflection and the like. Moreover, when the film thickness of the inorganic film 231 is 10 to 300 nm, the reflectance is decreased as compared with a case of a configuration in which the inorganic film 232 is a single film. It is therefore possible to further improve the reflectance to reduce flare and the like. As a result, image quality deterioration such as flare can be more reliably suppressed.

Moreover, the antireflection film 221 is formed on the surface of the on-chip microlens 114 so that damage to the on-chip microlens 114 can be suppressed. Note that, also in a case where the pixel 100 is a fine pixel, the antireflection film 221 can be formed on the surface of the on-chip microlens 114.

Example of Manufacturing Method

Figure 13:
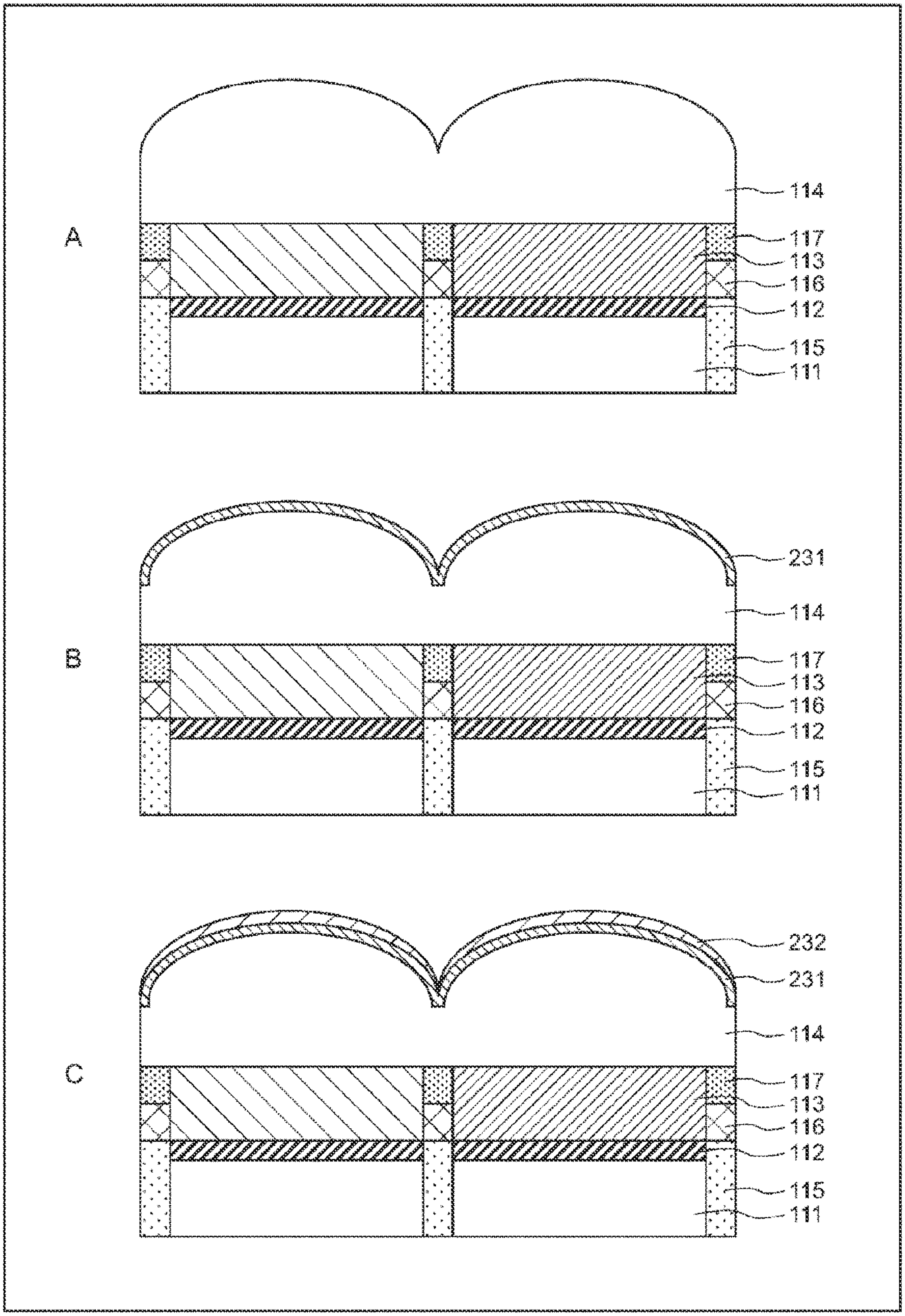
FIG. 13 is a diagram illustrating another example of the method of manufacturing the photodetection device to which the present disclosure is applied.
Figure 14:
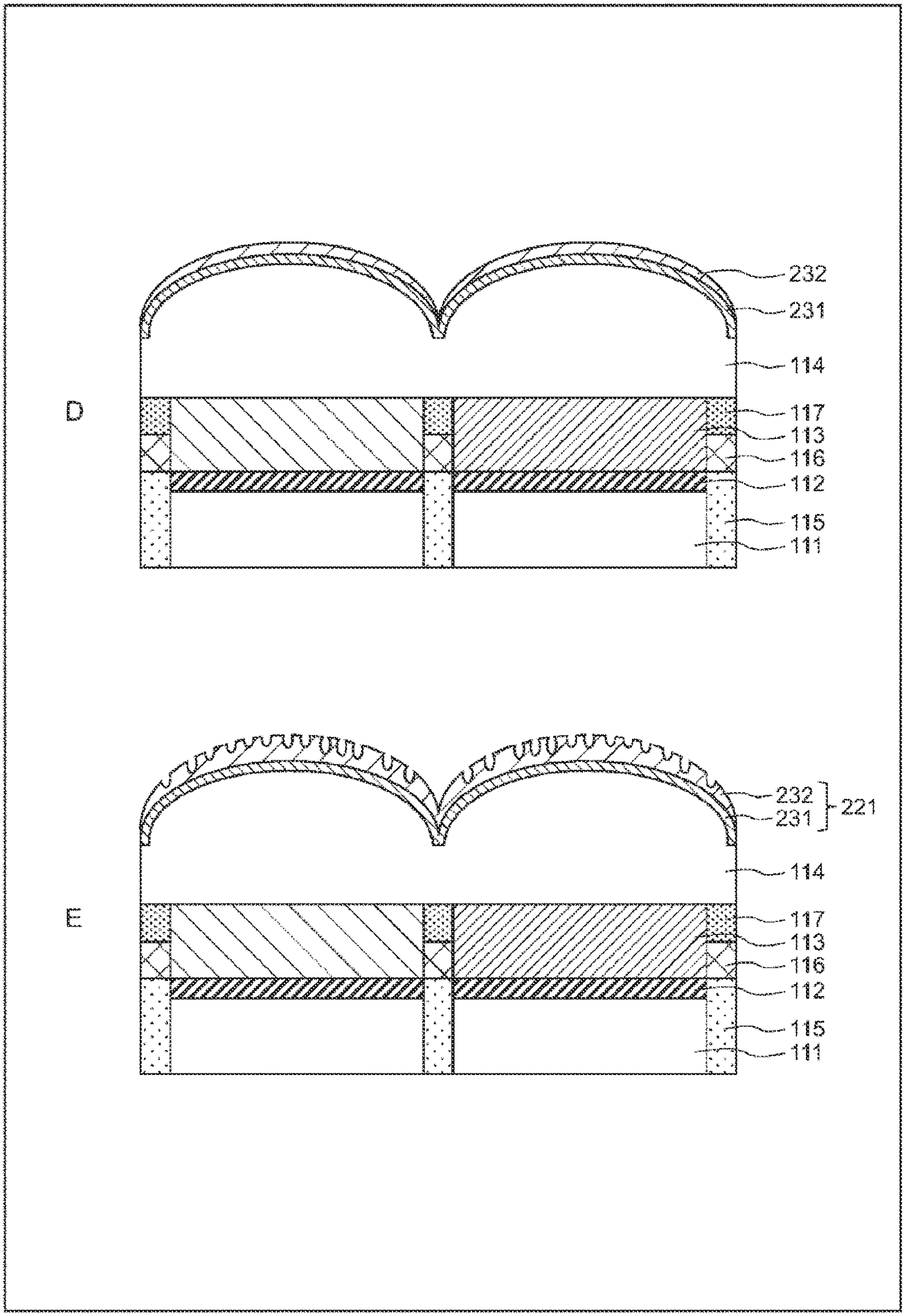
FIG. 14 is a diagram illustrating the other example of the method of manufacturing the photodetection device to which the present disclosure is applied.

FIGS. 13 and 14 are diagrams illustrating another example of the method of manufacturing the photodetection device to which the present disclosure is applied.

Similarly to FIG. 9, FIG. 13 illustrates steps performed after the on-chip microlens 114 is formed. That is, an imaging region is formed on a silicon substrate, in which photodiodes 111 and the like are formed so that a plurality of the pixels 100 is two-dimensionally arranged. Furthermore, insulating films 112 are formed on the upper surfaces of the photodiodes 111 and the surfaces are made flat, and color filters 113, each of which corresponds to a red, green, or blue wavelength, are formed thereon.

Then, as illustrated in A of FIG. 13, the on-chip microlenses 114 are formed on the color filters 113.

Next, as illustrated in B of FIG. 13, the inorganic film 231 is formed on the surface of the on-chip microlens 114. The inorganic film 231 can be formed by using the chemical vapor deposition (CVD) method, the physical vapor deposition (PVD) method, the atomic layer deposition (ALD) method, or the like. As the inorganic film 231, for example, an LTO film such as a silicon dioxide film is formed.

Next, as illustrated in C of FIG. 13, the inorganic film 232 is formed on the surface of the inorganic film 231. The inorganic film 232 can be formed by using the atomic layer deposition (ALD) method or the like. As the inorganic film 232, for example, an AlOx film is formed. The inorganic film 231 is an adhesion film (adhesion layer) for adhering the on-chip microlens 114 and the inorganic film 232.

Next, in D of FIG. 14, high-temperature treatment (e.g., treatment at 90° C.) with de-ionized water (DIW) is performed, and thus a structural film having a fine uneven shape is formed as the inorganic film 232 as illustrated in E of FIG. 14. That is, the inorganic film 232 is formed by an AlOx film or the like. In this way, the solid-state imaging device 10 is obtained, in which the antireflection film 221 constituted by two layers, the inorganic film 231 and the inorganic film 232 (two layers constituted by a low refractive index layer and an ultra-low refractive index layer), is formed on the surface of the on-chip microlens 114.

3. Modifications

Example of Photodetection Device

In the above description, a CMOS solid-state imaging device has been described as the solid-state imaging device 10, and the CMOS solid-state imaging device can have a back-illuminated structure in which light is incident from an upper layer (back side) on a side opposite to a wiring layer side (front side) formed in a lower layer when viewed from the silicon substrate on which the photodiodes 111 as photoelectric conversion units are formed. Note that the CMOS solid-state imaging device may have a front-illuminated structure in which light is incident from the wiring layer side (front side).

The solid-state imaging device 10 is an example of the photodetection device to which the present disclosure is applied. That is, the photodetection device to which the present disclosure is applied is not limited to the solid-state imaging device 10, and the present disclosure can be applied to, for example, a device that detects light, such as a distance measuring sensor that uses an IR laser. Note that the configuration of the antireflection film to which the present disclosure is applied is not limited to a CMOS solid-state imaging device, and the present disclosure can also be applied to a charge coupled device (CCD)-type solid-state imaging device.

In the above description, the solid-state imaging device 10 has a configuration in which the first conductivity type is p-type and the second conductivity type is n-type. Alternatively, the first conductivity type may be n-type and the second conductivity type may be p-type. Furthermore, while the above description shows a configuration in which primary color filters corresponding to wavelengths of red (R), green (G), and blue (B) are used as the color filters 113 in the solid-state imaging device 10, it is also possible to use complementary color filters corresponding to wavelengths of cyan (C), magenta (M), and yellow (Y).

(Configuration of Electronic Apparatus)

Figure 15:
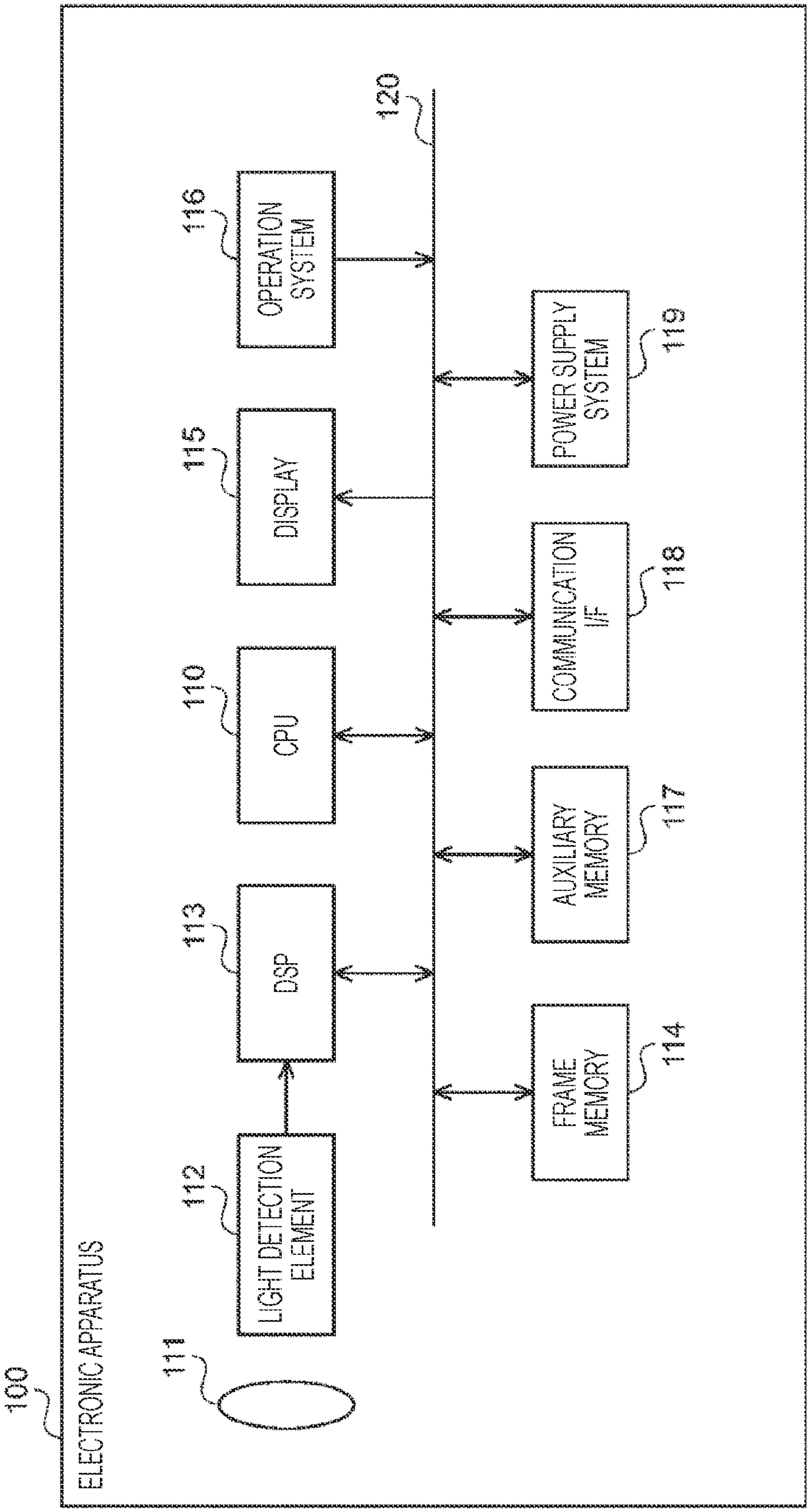
FIG. 15 is a block diagram illustrating a configuration example of an electronic apparatus on which the photodetection device to which the present disclosure is applied is mounted.

The photodetection device to which the present disclosure is applied can be mounted on an electronic apparatus such as a smartphone, a tablet terminal, a mobile phone, a digital still camera, or a digital video camera. FIG. 15 is a block diagram illustrating a configuration example of an electronic apparatus on which the photodetection device to which the present disclosure is applied is mounted.

In FIG. 15, an electronic apparatus 1000 has an imaging system constituted by an optical system 1011 including a lens group, a light detection element 1012 having a function corresponding to the solid-state imaging device 10 in FIG. 1, and a digital signal processor (DSP) 1013 that is a camera signal processing unit. The electronic apparatus 1000 has a configuration in which, in addition to the imaging system, a central processing unit (CPU) 1010, a frame memory 1014, a display 1015, an operation system 1016, an auxiliary memory 1017, a communication I/F 1018, and a power supply system 1019 are connected to one another via a bus 1020.

The CPU 1010 controls operation of each unit of the electronic apparatus 1000.

The optical system 1011 captures incident light (image light) from a subject, and forms an image on a light detection surface of the light detection element 1012. The light detection element 1012 converts the amount of the incident light the image of which has been formed on the light detection surface by the optical system 1011 into an electric signal for each pixel, and outputs the electric signal as a pixel signal. The DSP 1013 performs predetermined signal processing on the signal output from the light detection element 1012.

The frame memory 1014 temporarily records image data of a still image or a moving image captured by the imaging system. The display 1015 is a liquid crystal display or an organic EL display, and displays a still image or a moving image captured by the imaging system. The operation system 1016 issues operation commands for a wide variety of functions of the electronic apparatus 1000 in accordance with an operation by a user.

The auxiliary memory 1017 is a storage medium including a semiconductor memory such as a flash memory, and records image data of a still image or a moving image captured by the imaging system. The communication I/F 1018 has a communication module that supports a predetermined communication method, and sends image data of a still image or a moving image captured by the imaging system to another apparatus via a network.

The power supply system 1019 appropriately supplies various types of power serving as operation power to the CPU 1010, the DSP 1013, the frame memory 1014, the display 1015, the operation system 1016, the auxiliary memory 1017, and the communication I/F 1018 as supply targets.

4. Example of Application to Mobile Object

The technology (present technology) according to the present disclosure can be applied to a wide variety of products. For example, the technology according to the present disclosure may be implemented as a device to be mounted on any one of the following types of mobile objects: cars, electric cars, hybrid electric cars, motorcycles, bicycles, personal mobilities, airplanes, drones, ships, robots, and the like.

Figure 16:
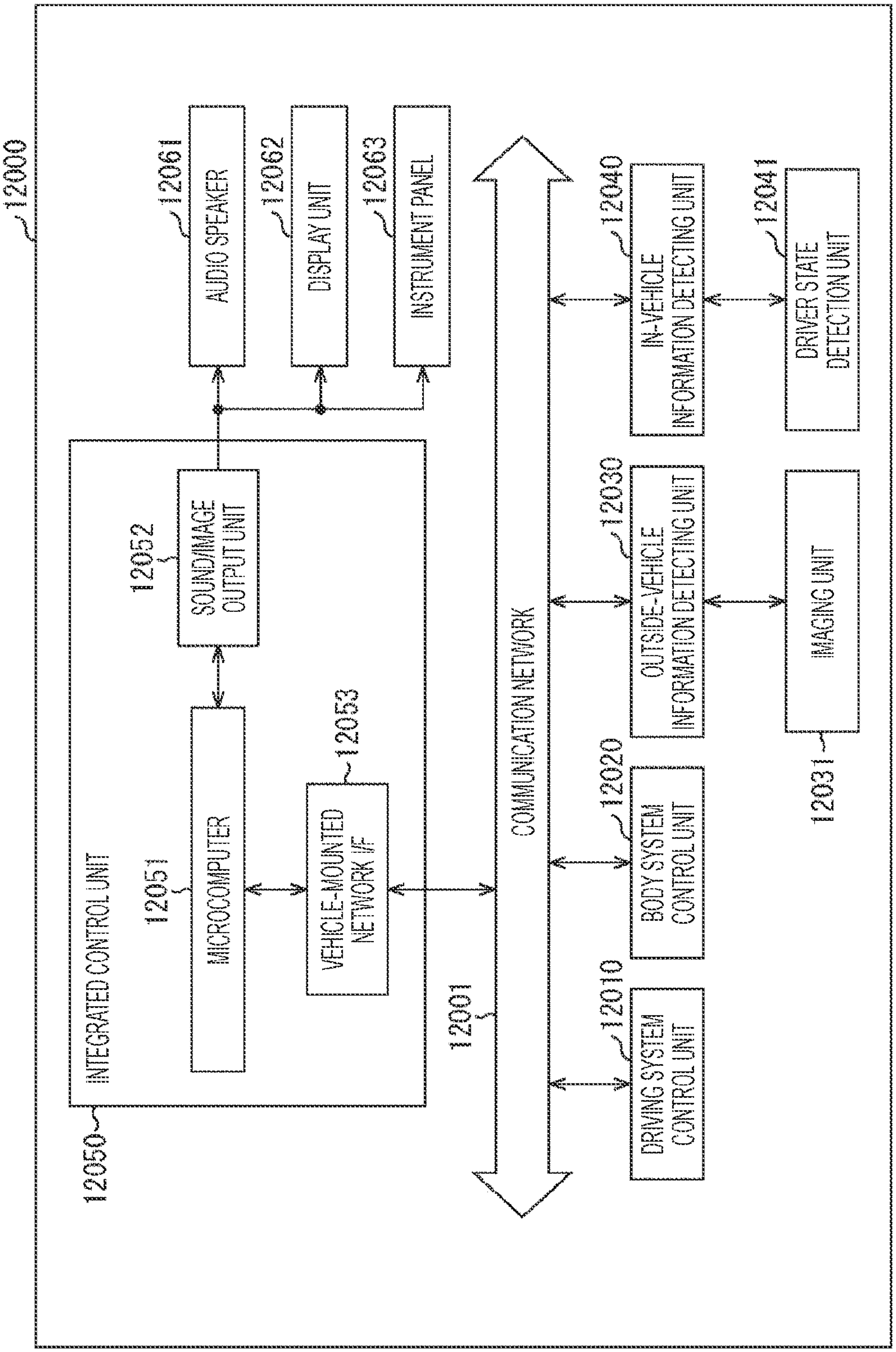
FIG. 16 is a block diagram illustrating an example of a schematic configuration of a vehicle control system.

FIG. 16 is a block diagram illustrating an example of a schematic configuration of a vehicle control system as an example of a mobile object control system to which the technology according to the present disclosure can be applied.

A vehicle control system 12000 is provided with a plurality of electronic control units connected to each other via a communication network 12001. In the example illustrated in FIG. 16, the vehicle control system 12000 is provided with a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output unit 12052, and a vehicle-mounted network interface (I/F) 12053 are illustrated as a functional configuration of the integrated control unit 12050.

The driving system control unit 12010 controls operation of devices related to a driving system of a vehicle in accordance with various programs. For example, the driving system control unit 12010 functions as a control device for: a driving force generating device for generating driving force of the vehicle, such as an internal combustion engine or a driving motor; a driving force transmitting mechanism for transmitting the driving force to wheels; a steering mechanism for adjusting a steering angle of the vehicle; a braking device for generating braking force of the vehicle; and the like.

The body system control unit 12020 controls operation of various devices provided on a vehicle body in accordance with various programs. For example, the body system control unit 12020 functions as a control device for a keyless entry system, a smart key system, a power window device, or various lamps such as a headlamp, a back lamp, a brake lamp, a blinker, or a fog lamp. In this case, radio waves transmitted from a portable device that substitutes for a key or signals of various switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle on which the vehicle control system 12000 is mounted. For example, the outside-vehicle information detecting unit 12030 is connected with an imaging unit 12031. The outside-vehicle information detecting unit 12030 causes the imaging unit 12031 to capture an image of the outside of the vehicle, and receives the captured image. On the basis of the received image, the outside-vehicle information detecting unit 12030 may perform processing of detecting an object such as a human, an automobile, an obstacle, a sign, or a character on a road surface, or processing of detecting a distance thereto.

The imaging unit 12031 is an optical sensor that receives light, and which outputs an electric signal corresponding to a received light amount of the light. The imaging unit 12031 can output the electric signal as an image, or can output the electric signal as information about a measured distance. Furthermore, the light received by the imaging unit 12031 may be visible light, or may be invisible light such as infrared rays or the like.

The in-vehicle information detecting unit 12040 detects information about the inside of the vehicle. The in-vehicle information detecting unit 12040 is connected with, for example, a driver state detection unit 12041 that detects the state of a driver. The driver state detection unit 12041 may include, for example, a camera that images the driver, and, on the basis of detection information input from the driver state detection unit 12041, the in-vehicle information detecting unit 12040 may calculate a degree of fatigue or a degree of concentration of the driver, or may determine whether or not the driver is dozing off.

The microcomputer 12051 can calculate a control target value for the driving force generating device, the steering mechanism, or the braking device on the basis of the information about the inside or outside of the vehicle acquired by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS), the functions including: collision avoidance or shock mitigation for the vehicle; follow-up traveling based on an inter-vehicle distance; vehicle speed maintaining traveling; vehicle collision warning; and vehicle lane departure warning.

Furthermore, the microcomputer 12051 can perform cooperative control intended for automated driving, in which the vehicle travels in an automated manner without depending on operation of the driver, or the like, by controlling the driving force generating device, the steering mechanism, the braking device, or the like on the basis of information about the vehicle's surroundings acquired by the outside-vehicle information detecting unit 12030 or the in-vehicle information detecting unit 12040.

Furthermore, the microcomputer 12051 can output a control command to the body system control unit 12020 on the basis of information about the outside of the vehicle acquired by the outside-vehicle information detecting unit 12030. For example, the microcomputer 12051 can perform cooperative control intended to prevent a glare, such as switching from a high beam to a low beam by controlling the headlamp in accordance with the position of a preceding vehicle or an oncoming vehicle detected by the outside-vehicle information detecting unit 12030.

The sound/image output unit 12052 sends an output signal of at least one of a sound or an image to an output device capable of visually or audibly notifying an occupant of the vehicle or the outside of the vehicle of information. In the example in FIG. 16, an audio speaker 12061, a display unit 12062, and an instrument panel 12063 are illustrated as the output device. The display unit 12062 may, for example, include at least one of an on-board display or a head-up display.

Figure 17:
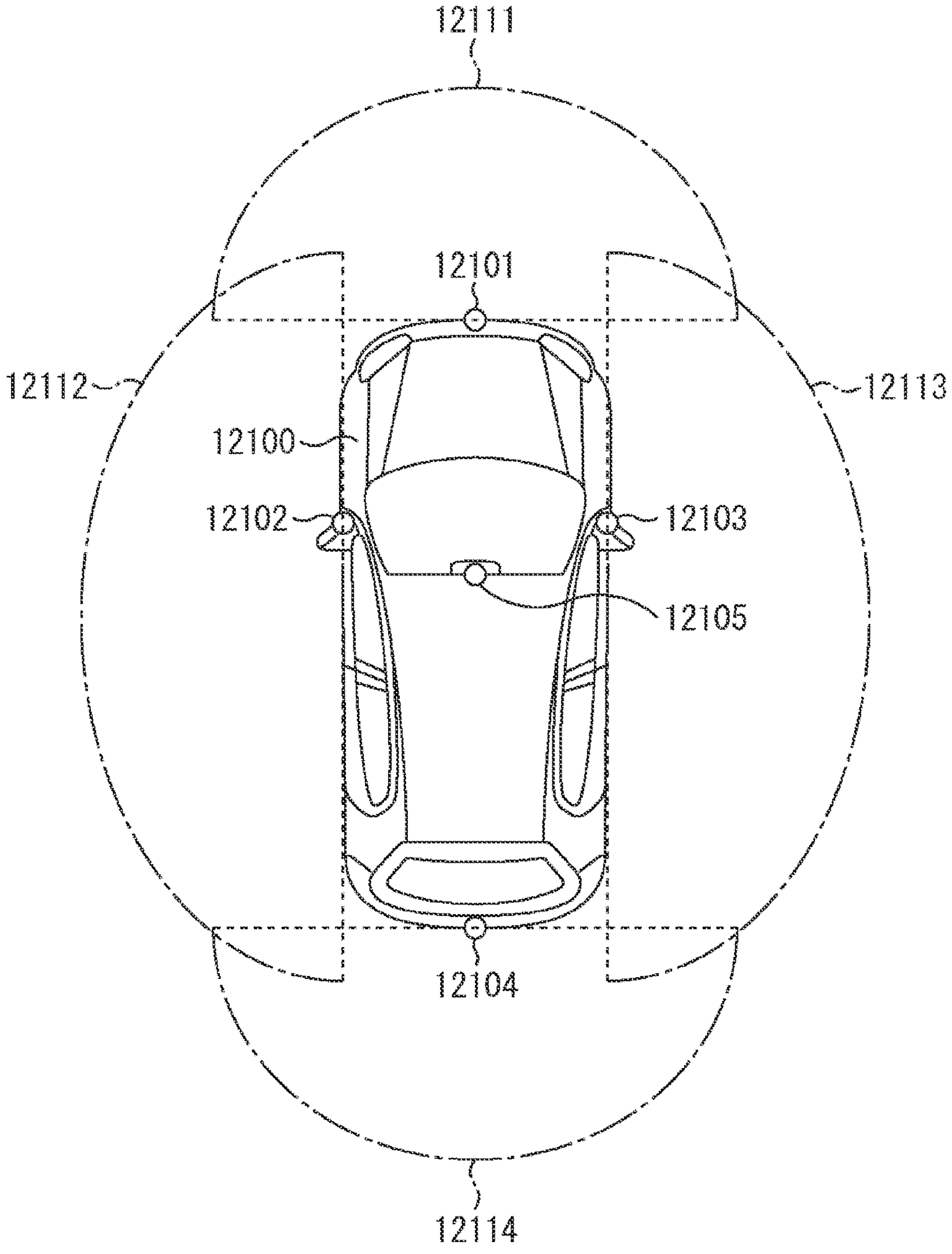
FIG. 17 is an explanatory diagram illustrating an example of installation positions of an outside-vehicle information detection unit and an imaging unit.

FIG. 17 is a diagram illustrating an example of the installation position of the imaging unit 12031.

In FIG. 17, a vehicle 12100 has imaging units 12101, 12102, 12103, 12104, and 12105 as the imaging unit 12031.

The imaging units 12101, 12102, 12103, 12104, and 12105 are, for example, provided at positions on a front nose, sideview mirrors, a rear bumper, and a back door of the vehicle 12100 as well as a position on an upper portion of a windshield within the interior of the vehicle. The imaging unit 12101 provided on the front nose and the imaging unit 12105 provided on the upper portion of the windshield within the interior of the vehicle acquire mainly images of the forward view from the vehicle 12100. The imaging units 12102 and 12103 provided on the sideview mirrors acquire mainly images of the side views from the vehicle 12100. The imaging unit 12104 provided on the rear bumper or the back door acquires mainly images of the rearward view from the vehicle 12100. The images of the forward view acquired by the imaging units 12101 and 12105 are mainly used to detect a preceding vehicle, a pedestrian, an obstacle, a traffic light, a traffic sign, a lane, or the like.

Note that FIG. 17 illustrates an example of imaging ranges of the imaging units 12101 to 12104. An imaging range 12111 indicates the imaging range of the imaging unit 12101 provided on the front nose. Imaging ranges 12112 and 12113 respectively indicate the imaging ranges of the imaging units 12102 and 12103 provided on the sideview mirrors. An imaging range 12114 indicates the imaging range of the imaging unit 12104 provided on the rear bumper or the back door. A bird's-eye image of the vehicle 12100 as viewed from above is obtained by superimposing pieces of image data captured by the imaging units 12101 to 12104, for example.

At least one of the imaging units 12101 to 12104 may have a function of acquiring distance information. For example, at least one of the imaging units 12101 to 12104 may be a stereo camera constituted by a plurality of imaging elements, or may be an imaging element having pixels for phase difference detection.

For example, the microcomputer 12051 can obtain a distance to each three-dimensional object in the imaging ranges 12111 to 12114 and a temporal change in the distance (relative speed with respect to the vehicle 12100) on the basis of the distance information obtained from the imaging units 12101 to 12104, and thereby extract, as a preceding vehicle, a nearest three-dimensional object that is in particular on a traveling path of the vehicle 12100 and is traveling in substantially the same direction as the vehicle 12100 at a predetermined speed (e.g., 0 km/h or higher). Moreover, the microcomputer 12051 can set an inter-vehicle distance to be maintained from a preceding vehicle in advance, and perform automatic brake control (including following stop control), automatic acceleration control (including following start control), or the like. It is thus possible to perform cooperative control intended for automated driving, in which the vehicle travels in an automated manner without depending on operation of the driver, or the like.

For example, the microcomputer 12051 can classify three-dimensional object data regarding three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging units 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display unit 12062, and performs forced deceleration or avoidance steering via the driving system control unit 12010. The microcomputer 12051 can thereby assist in driving to avoid collision.

At least one of the imaging units 12101 to 12104 may be an infrared camera that detects infrared rays. The microcomputer 12051 can, for example, recognize a pedestrian by determining whether or not there is a pedestrian in images captured by the imaging units 12101 to 12104. Such recognition of a pedestrian is, for example, performed by a procedure of extracting feature points in the images captured by the imaging units 12101 to 12104 as infrared cameras, and a procedure of performing pattern matching processing on a series of feature points representing the contour of an object and determining whether or not the object is a pedestrian. When the microcomputer 12051 determines that there is a pedestrian in the images captured by the imaging units 12101 to 12104, and thus recognizes the pedestrian, the sound/image output unit 12052 controls the display unit 12062 so that a square contour line for emphasis is displayed so as to be superimposed on the recognized pedestrian. Furthermore, the sound/image output unit 12052 may also control the display unit 12062 so that an icon or the like representing the pedestrian is displayed at a desired position.

An example of the vehicle control system to which the technology according to the present disclosure can be applied has been described above. The technology according to the present disclosure may be applied to the imaging unit 12031 among the configurations described above. Specifically, the solid-state imaging device 10 in FIG. 1 can be applied to the imaging unit 12031. By applying the technology according to the present disclosure to the imaging unit 12031, image quality deterioration such as flare can be suppressed, and a more easily viewable captured image can be obtained, so that driver's fatigue can be reduced.

Note that embodiments of the present disclosure are not limited to the above-described embodiments, and a variety of modifications are possible without departing from the scope of the present disclosure. Furthermore, the effects described herein are merely examples and are not limited, and other effects may be provided.

Furthermore, the present disclosure can have the following configurations.

(1)

A photodetection device including:

a plurality of pixels that have photoelectric conversion units;

on-chip microlenses that are formed in such a way as to correspond to the individual pixels; and an antireflection film that is formed on a surface of the on-chip microlens, in which the antireflection film is constituted by a stacking of:

a first inorganic film that is formed by a metal oxide film; and a second inorganic film that is formed on a surface of the first inorganic film and has a lower refractive index than the first inorganic film.

(2)

The photodetection device according to (1), in which the first inorganic film is a tantalum oxide film, a niobium oxide film, a titanium oxide film, or a hafnium oxide film.

(3)

The photodetection device according to (1) or (2), in which the second inorganic film is a silicon dioxide film or a silicon oxycarbide film.

(4)

The photodetection device according to any one of (1) to (3), in which the first inorganic film has a refractive index of 1.8 or more, and the second inorganic film has a refractive index of 1.55 or less.

(5)

The photodetection device according to any one of (1) to (4), in which the first inorganic film has a film thickness equal to or smaller than a film thickness of the second inorganic film.

(6)

The photodetection device according to (5), in which the antireflection film has a film thickness of 200 nm or less.

(7)

The photodetection device according to any one of (1) to (6), in which the first inorganic film is formed on the surface of the on-chip microlens, and the second inorganic film is formed at an outermost surface.

(8)

The photodetection device according to any one of (1) to (7), in which the first inorganic films and the second inorganic films are alternately stacked.

(9)

The photodetection device according to (1), in which the first inorganic film is an adhesion film formed on the surface of the on-chip microlens to bring the on-chip microlens and the second inorganic film into close contact with each other, and the second inorganic film is a structural film formed at an outermost surface and having a fine uneven shape.

(10)

The photodetection device according to (9), in which the first inorganic film is an LTO film, and the second inorganic film is formed by an AlOx film.

(11)

The photodetection device according to (9) or (10), in which the first inorganic film has a film thickness of 10 nm or more and 300 nm or less.

(12)

The photodetection device according to any one of (1) to (8), in which the antireflection film has a film thickness that is smaller at a portion corresponding to an edge portion of the on-chip microlens than at a portion corresponding to a central portion of the on-chip microlens.

(13)

The photodetection device according to (12), in which the film thickness of the antireflection film becomes smaller from the portion corresponding to the central portion of the on-chip microlens to the portion corresponding to the edge portion.

(14)

The photodetection device according to any one of (12) or (13), in which a position of a first center of a circle indicating a curvature of the surface of the on-chip microlens and a position of a second center of a circle indicating a curvature of a surface of the antireflection film do not coincide with each other.

(15)

The photodetection device according to (14), in which the second center is positioned on a light incident side with respect to the first center.

(16)

The photodetection device according to (14) or (15), in which the second center includes a center of a circle indicating a curvature of the surface of each of the first inorganic film and the second inorganic film.

(17)

The photodetection device according to any one of (1) to (8) and (12) to (16), in which the antireflection film is formed between the on-chip microlenses.

(18)

The photodetection device according to (17), in which a flat portion is formed between the on-chip microlenses, and the antireflection film has a film thickness that is substantially the same at a portion corresponding to the flat portion and at a portion corresponding to a central portion of the on-chip microlens.

(19)

A photodetection device including:

a plurality of pixels that have photoelectric conversion units;

on-chip microlenses that are formed in such a way as to correspond to the individual pixels; and an antireflection film that is formed on a surface of the on-chip microlens, in which the antireflection film is constituted by a stacking of:

a first inorganic film; and a second inorganic film that is a structural film formed on a surface of the first inorganic film and formed by processing a surface of a film to be processed having a predetermined refractive index into a fine uneven shape.

(20)

The photodetection device according to (19), in which the first inorganic film is an adhesion film formed on the surface of the on-chip microlens to bring the on-chip microlens and the second inorganic film into close contact with each other, and the second inorganic film is a structural film formed at an outermost surface.

(21)

The photodetection device according to (19) or (20), in which the first inorganic film is an LTO film, and the film to be processed is an AlOx film.

(22)

The photodetection device according to any one of (19) to (21), in which the first inorganic film has a film thickness of 10 nm or more and 300 nm or less.

(23)

An electronic apparatus on which a photodetection device is mounted, the photodetection device including:

a plurality of pixels that have photoelectric conversion units;

on-chip microlenses that are formed in such a way as to correspond to the individual pixels; and an antireflection film that is formed on a surface of the on-chip microlens, in which the antireflection film is constituted by a stacking of:

a first inorganic film that is formed by a metal oxide film; and a second inorganic film that is formed on a surface of the first inorganic film and has a lower refractive index than the first inorganic film.

REFERENCE SIGNS LIST

10 Solid-state imaging device
21 Pixel array unit
22 Vertical drive unit
23 Column signal processing unit
24 Horizontal drive unit
25 Output unit
26 Control unit
100 Pixel
111 Photodiode
114 On-chip microlens

121 Antireflection film
131 Inorganic film
132 Inorganic film
141 Inorganic film
142 Inorganic film
143 Inorganic film
144 Inorganic film
221 Antireflection film
231 Inorganic film
232 Inorganic film
1000 Electronic apparatus
1012 Light detection element

What is claimed is:

1. A photodetection device, comprising:

a plurality of pixels that have photoelectric conversion units;

a plurality of circular, continuously formed on-chip microlenses, wherein each on-chip microlens of the plurality of microlenses is formed in such a way as to correspond to one individual pixel of the plurality of pixels; and an antireflection film that is formed on a surface of each on-chip microlens distal from the plurality of pixels, wherein the antireflection film is constituted by a stacking of:

a first inorganic film; and a second inorganic film that is formed to have a fine uneven shape on a surface of the first inorganic film and has a lower refractive index than the first inorganic film.

2. The photodetection device according to claim 1, wherein the first inorganic film is a tantalum oxide film, a niobium oxide film, a titanium oxide film, or a hafnium oxide film.

3. The photodetection device according to claim 2, wherein the second inorganic film is a silicon dioxide film or a silicon oxycarbide film.

4. The photodetection device according to claim 1, wherein the first inorganic film has a refractive index of 1.8 or more, and the second inorganic film has a refractive index of 1.55 or less.

5. The photodetection device according to claim 1, wherein a film thickness of the first inorganic film is less or equal to a film thickness of the second inorganic film all along an arcuate portion of each on-chip microlens.

6. The photodetection device according to claim 5, wherein the antireflection film has a film thickness of less than or equal to 200 nanometers (nm).

7. The photodetection device according to claim 1, wherein the first inorganic film is disposed between each on-chip microlens and the second inorganic film.

8. The photodetection device according to claim 7, wherein the first inorganic film is an adhesion film to bring each on-chip microlens and the second inorganic film into close contact with each other and is formed as a low temperature oxidation silicon dioxide film having a refractive index of less than or equal to 1.55.

9. The photodetection device according to claim 8, wherein the second inorganic film is a structural film formed as an aluminum oxide film.

10. The photodetection device according to claim 9, wherein a film thickness of at least one of the first inorganic film and the second inorganic film disposed on an arcuate portion of each on-chip microlens is greatest at a center of each on-chip microlens and radially tapers to a lesser thickness at a circumference of each on-chip microlens.

11. The photodetection device according to claim 10, wherein the first inorganic film has a film thickness of from 5 nm to 1000 nm.

12. The photodetection device according to claim 10, wherein a maximum film thickness from a highest protrusion of the fine uneven shape of the second inorganic film to an interface with the first inorganic film is approximately 270 nm.

13. The photodetection device according to claim 1, wherein a film thickness of the antireflection film disposed on an arcuate portion of each on-chip microlens is greatest at a center of each on-chip microlens and radially tapers to a lesser thickness at a circumference of each on-chip microlens.

14. The photodetection device according to claim 1, wherein a radius of curvature of a surface of the second inorganic film distal from the plurality of pixels is different than a radius of curvature of a surface of the first inorganic film distal from the plurality of pixels.

15. The photodetection device according to claim 1, wherein a radius of curvature of a surface of the first inorganic film distal from the distal from the plurality of pixels is different than a radius of curvature of a surface of each on-chip microlens distal from the distal from the plurality of pixels.

16. The photodetection device according to claim 1, wherein a radius of curvature of a surface of the second inorganic film distal from the distal from the plurality of pixels is different than a radius of curvature of a surface of each on-chip microlens distal from the distal from the plurality of pixels.

17. The photodetection device according to claim 1, further comprising a plurality flat portions separating the arcuate portion of each on-chip microlens, wherein the antireflection film is further formed on a surface of each flat portion of the plurality of flat portions.

18. The photodetection device according to claim 1, wherein a film thickness of the first inorganic film and a film thickness of the second inorganic film disposed on an arcuate portion of each on-chip microlens is greatest at a center of each on-chip microlens and radially tapers to a lesser thickness at a circumference of each on-chip microlens.

19. A photodetection device, comprising:

a plurality of pixels that have photoelectric conversion units;

a plurality of circular, continuously formed on-chip microlenses, wherein each on-chip microlens of the plurality of microlens is formed in such a way as to correspond to one individual pixel of the plurality of pixels; and an antireflection film that is formed on a surface of each on-chip microlens distal from the plurality of pixels, wherein the antireflection film is constituted by a stacking of:

a first inorganic film; and a second inorganic film that is a structural film formed on a surface of the first inorganic film and has a lower refractive index than the first inorganic film, and wherein the second inorganic is formed by processing a surface of a film to be processed having a predetermined refractive index into a fine uneven shape.

20. The photodetection device according to claim 19, wherein the first inorganic film is an adhesion film disposed between each on-chip microlens and the second inorganic film to bring the on-chip microlens and the second inorganic film into close contact with each other and is formed as a low temperature oxidation silicon dioxide film having a refractive index of less than or equal to 1.55.

21. The photodetection device according to claim 20, wherein the film to be processed is an aluminum oxide film, and wherein the predetermined refractive index is 1.6.

22. The photodetection device according to claim 21, wherein as processed, the second inorganic film has a refractive index of 1.3.

23. An electronic apparatus on which a photodetection device is mounted, the photodetection device including:

a plurality of pixels that have photoelectric conversion units;

a plurality of circular, continuously formed on-chip microlenses, wherein each on-chip microlens of the plurality of microlenses is formed in such a way as to correspond to one individual pixel of the plurality of pixels; and an antireflection film that is formed on a surface of each on-chip microlens distal from the plurality of pixels, wherein the antireflection film is constituted by a stacking of:

a first inorganic film that is formed as a low temperature oxidation silicon dioxide film; and a second inorganic film that is formed as a fine uneven shape of aluminum oxide on a surface of the first inorganic film and has a lower refractive index than the first inorganic film.

* * * * *